United States Patent
Lu

(10) Patent No.: US 12,439,543 B2
(45) Date of Patent: Oct. 7, 2025

(54) POWER SUPPLY COOLING STRUCTURE

(71) Applicant: AA Power Inc., Boston, MA (US)

(72) Inventor: Qun Lu, Lexington, MA (US)

(73) Assignee: AA Power Inc., Boston, MA (US)

( * ) Notice: Subject to any disclaimer, the term of this patent is extended or adjusted under 35 U.S.C. 154(b) by 217 days.

(21) Appl. No.: 18/240,346

(22) Filed: Aug. 30, 2023

(65) Prior Publication Data

US 2024/0090153 A1 Mar. 14, 2024

Related U.S. Application Data

(60) Provisional application No. 63/375,549, filed on Sep. 14, 2022.

(51) Int. Cl.
H05K 7/14 (2006.01)
H05K 1/02 (2006.01)
H05K 7/20 (2006.01)

(52) U.S. Cl.
CPC ......... *H05K 7/14322* (2022.08); *H05K 1/021* (2013.01); *H05K 7/202* (2013.01)

(58) Field of Classification Search
CPC ..... H05K 7/14322; H05K 7/202; H05K 1/021
USPC ......................................... 361/704
See application file for complete search history.

(56) References Cited

U.S. PATENT DOCUMENTS

| | | | |
|---|---|---|---|
| 2006/0109629 A1* | 5/2006 | Harris | H01L 23/433 257/E23.09 |
| 2018/0327256 A1* | 11/2018 | Lee | G01S 7/5208 |
| 2018/0352666 A1* | 12/2018 | Liskow | H05K 3/368 |
| 2023/0164958 A1* | 5/2023 | Yoshimi | H05K 1/181 361/715 |

* cited by examiner

*Primary Examiner* — Zhengfu J Feng
(74) *Attorney, Agent, or Firm* — AP3 Law Firm PLLC

(57) ABSTRACT

An apparatus includes a case, a first printed circuit board (PCB) and a second PCB within the case. The case includes a top portion and a bottom portion opposite to each other. The first PCB has a first surface and a second surface opposite to each other, and is attached to the top portion of the case via the second surface of the first PCB. At least one heat-generating device is mounted on the first surface of the first PCB. The second PCB has a first surface and a second surface opposite to each other, and is attached to the bottom portion of the case via the second surface of the second PCB. At least one heat-generating device is mounted on the first surface of the second PCB. The apparatus may include more PCBs. An inner shell may be provided forming an air duct within the case.

20 Claims, 32 Drawing Sheets

POWER SUPPLY COOLING STRUCTURE

CROSS-REFERENCE TO RELATED APPLICATIONS

This patent application claims priority to U.S. Provisional Application No. 63/375,549, filed on Sep. 14, 2022 and entitled "Windless Power Supply Cooling Structure," which is hereby incorporated by reference herein as if reproduced in its entirety.

TECHNICAL FIELD

The present disclosure relates to power supply systems, and in particular, to a power supply cooling structure.

BACKGROUND

The primary heat dissipation path of a windless power supply is generally from heat-generating devices to a heat dissipation case of the power supply. Heat exchange for the power supply is carried out through a large exterior area of the heat dissipation case and the surrounding air. The conventional printed circuit board (PCB) layout has a longer path from the power devices to the heat dissipation case. This longer path means a higher thermal resistance.

FIG. 1 is a diagram of an example layout 100 of a conventional power supply device. In this example, heat generating power devices 102 (also referred to as heat generating devices) are assembled to a heat sink 104, and the heat sink 104 is plugged into a PCB 106 mounted to a heat dissipation case 108. Such a layout may have a very high thermal resistance from the heat generating devices 102 to the heat dissipation case 108 under a windless condition of the power supply device. Under a windless condition, no fan or a similar technique is used in the power supply device to actively generate wind to cause airflow. The heat from the heat generating devices 102 may be transferred to the heat sink 104, while the heat sink 104 is not in contact with the heat dissipation case 108. As a result, the heat transfer resistance by air alone is very high, resulting in low heat dissipation efficiency.

It is thus desirable to overcome the shortcomings of the existing solutions for power supply heat dissipation, and provide a power supply cooling structure with a low thermal resistance, in order to effectively reduce temperature rise of the power supply systems and devices.

SUMMARY

These and other problems are generally solved or circumvented, and technical advantages are generally achieved, by embodiments of the present disclosure which provide a power supply cooling structure.

According to one aspect of the present disclosure, an apparatus is provided that includes a first case comprising a top portion and a bottom portion opposite to each other. The apparatus further includes a first circuit board within the first case, the first circuit board having a first surface and a second surface opposite to each other, and the first circuit board attached to the top portion of the first case via the second surface of the first circuit board, with at least one first heat-generating device mounted on the first surface of the first circuit board. The apparatus also includes a second circuit board within the first case, the second circuit board having a first surface and a second surface opposite to each other, and the second circuit board attached to the bottom portion of the first case via the second surface of the second circuit board, with at least one second heat-generating device mounted on the first surface of the second circuit board.

According to another aspect of the present disclosure, an apparatus is provided that includes a first case comprising a top portion and a bottom portion opposite to each other. The apparatus also includes a first printed circuit board (PCB) within the first case, the first PCB having a first surface and a second surface opposite to each other, the first PCB attached to the top portion of the first case via the second surface of the first PCB, and at least one first heat-generating device mounted on the first surface of the first PCB; and a second PCB within the first case, the second PC having a first surface and a second surface opposite to each other, the second PCB attached to the bottom portion of the first case via the second surface of the second PCB, and at least one second heat-generating device mounted on the first surface of the second PCB. The apparatus further includes a third PCB within the first case, the third PCB being connected between the first PCB and the second PCB along a first sidewall of the first case; and a fourth PCB within the first case, the fourth PCB being connected between the first PCB and the second PCB along a second sidewall of the first case, and the third PCB and the fourth PCB opposite to each other.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

Figure 1:
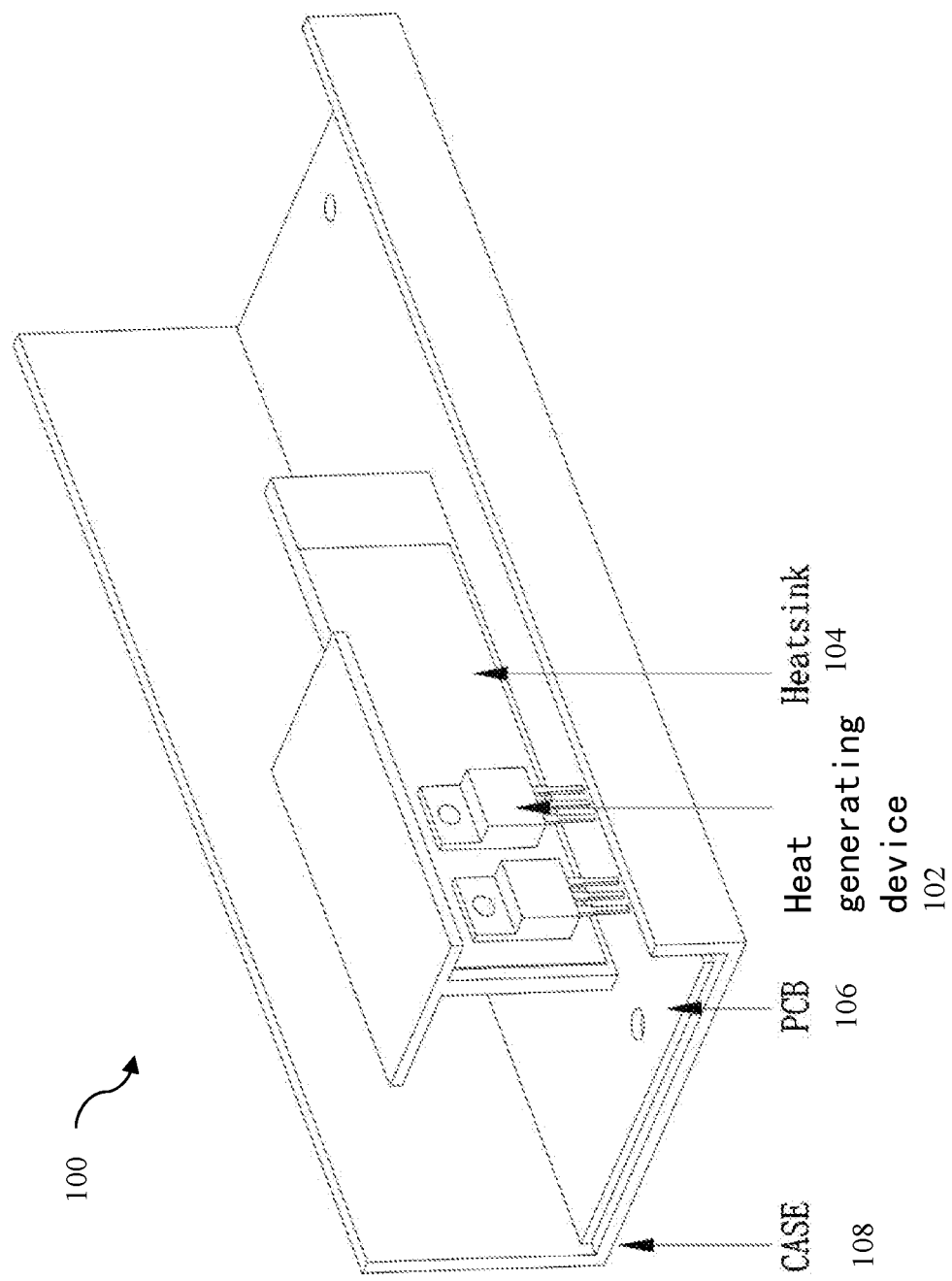
FIG. 1 illustrates a layout of a conventional power supply device.

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Embodiments of the present disclosure provide power supply devices/systems with various structures that facilitate heat dissipation. The embodiments of the present disclosure will be described in the following in a specific context, namely, a windless power supply cooling structure, for illustrative purposes only. Embodiment windless power supply cooling structures may be applied to a variety of power conversion/supply systems, e.g., power supply devices/systems using various cooling techniques, e.g., water cooling, liquid cooling. The power supply devices/systems may be used in a variety of information technology (IT) equipments and facilities, such as a data center, servers, communication equipments, and so on. Hereinafter, various embodiments will be explained in detail with reference to the accompanying drawings.

As used herein, "a windless power supply" is used to indicate a power supply device with no fan or similar technique(s) used to generate wind flow, e.g., for cooling or heat dissipation. The heat of power devices or heat generating devices is exchanged/dissipated through system airflow (or system flow) of a power supply system. Embodiments of the present disclosure provide power supply cooling structures and techniques that reduce thermal resistance, increase heat dissipation efficiency. The windless power supply cooling structure may also be referred to as a windless power module cooling structure, a windless power module heat dissipation structure, or a windless power supply heat dissipation structure.

Some embodiments of the present disclosure are realized by the following technical solution: a windless power module cooling structure is provided that includes a plurality of printed circuit boards (PCBs), e.g., a first PCB (e.g., a PCB assembly 1 (PCBA1)) and a second PCB (PCBA2), a flexible cable/wire connected between PCBA1 and PCBA2, a top heat dissipation case, a bottom heat dissipation case, a thermally conductive potting adhesive layer and a thermally conductive insulating spacer.

PCBA1 and PCBA2 may be assembled with components (e.g., power devices, heat generating devices), and the components may be mounted on a PCB, e.g., PCBA1 and PCBA2, in the form of surface mounting technology (SMT). PCBA1 and PCBA2 may both include a heat dissipation copper sheet mounted in the form of SMT, and the heat dissipation copper sheet may be mounted close to heat generating components, e.g., power-generating devices or power devices. The copper sheet may be used for further heat dissipation. PCBA1 and PCBA2 may both include connector sockets mounted in the form of SMT for the flexible cable to be connected between PCBA1 and PCBA2. PCBA1 and PCBA2 may both include an electromagnetic interference (EMI) shield, which may be mounted in the position of power devices, e.g., power switches, and may be grounded to a heat dissipation case through a PCB. The terms of "PCB" and "PCBA" may be used interchangeably in the description of the present disclosure. The terms of "power supply" and "power supply device" may be used interchangeably in the description of the present disclosure. By use of the plurality of PCBAs, the windless power module cooling structure may be viewed as having a multi-PCB layout.

PCBA1 and PCBA2 may be fixed to the top and bottom heat dissipation cases respectively, and thermally conductive insulating spacers may be attached between a PCB and the corresponding heat dissipation case. The flexible cable may be plugged into the connector sockets on PCBA1 and PCBA2 respectively to realize the electrical connection between PCBA1 and PCBA2. Thermally conductive potting glue/adhesive may be used between PCBA1 and the top heat dissipation case. Likewise, thermally conductive potting glue/adhesive may be used between PCBA2 and the bottom heat dissipation case. The heat is transferred from PCBA1 and PCBA2 to the heat dissipation cases by means of the thermally conductive potting glue/adhesive layers. At least the following functions and benefits are provided by embodiments of the present disclosure.

First, the components are assembled to the PCBs (e.g., PCBA1 and PCBA2) by using SMT, which greatly reduces the height of the PCBs, and saves the space inside the cases, creating system air ducts to reduce air resistance and improve heat dissipation.

Second, the use of the multi-PCB layout increases the effective area of the PCBs (e.g., PCBA1 and PCBA2), facilitating the placement of power devices, and the larger PCB area results in lower thermal resistance and better heat dissipation (the solution is not limited to two PCBs. More PCBs as needed may be employed, such as PCBA3/PCBA4/PCBA5).

Third, the PCBs, assembled in the form of SMT, may have a smaller distance to the heat dissipation cases, reducing the thermal resistance from the PCBs (PCBA1 and PCBA2) to the heat dissipation cases and increasing the heat sink efficiency.

Fourth, a heat sink on the PCB may be used to transfer heat to the heat dissipation case, which further reduces the distance between the PCB and the heat dissipation case, reduces thermal resistance and improves heat dissipation efficiency.

Fifth, a thermally conductive potting compound may be filled between the PCB and the heat dissipation case, which further reduces thermal resistance and increases heat dissipation efficiency.

Sixth, the soft row of wires/cables (or flexible wires/cables) connecting PCBA1 and PCBA2 can eliminate the stress during assembly and ensure product reliability, and in some cases, the soft row of wires/cables may be replaced by a multi-pin connector (e.g., upper and lower PCBAs may be directly connected to each other when the two PCBAs are aligned, or side PCBAs may be connected to PCBA1 or PCBA2 by means of curved pins).

Seventh, the PCBs and the corresponding shields may be grounded to improve the EMI performance.

Figure 2:
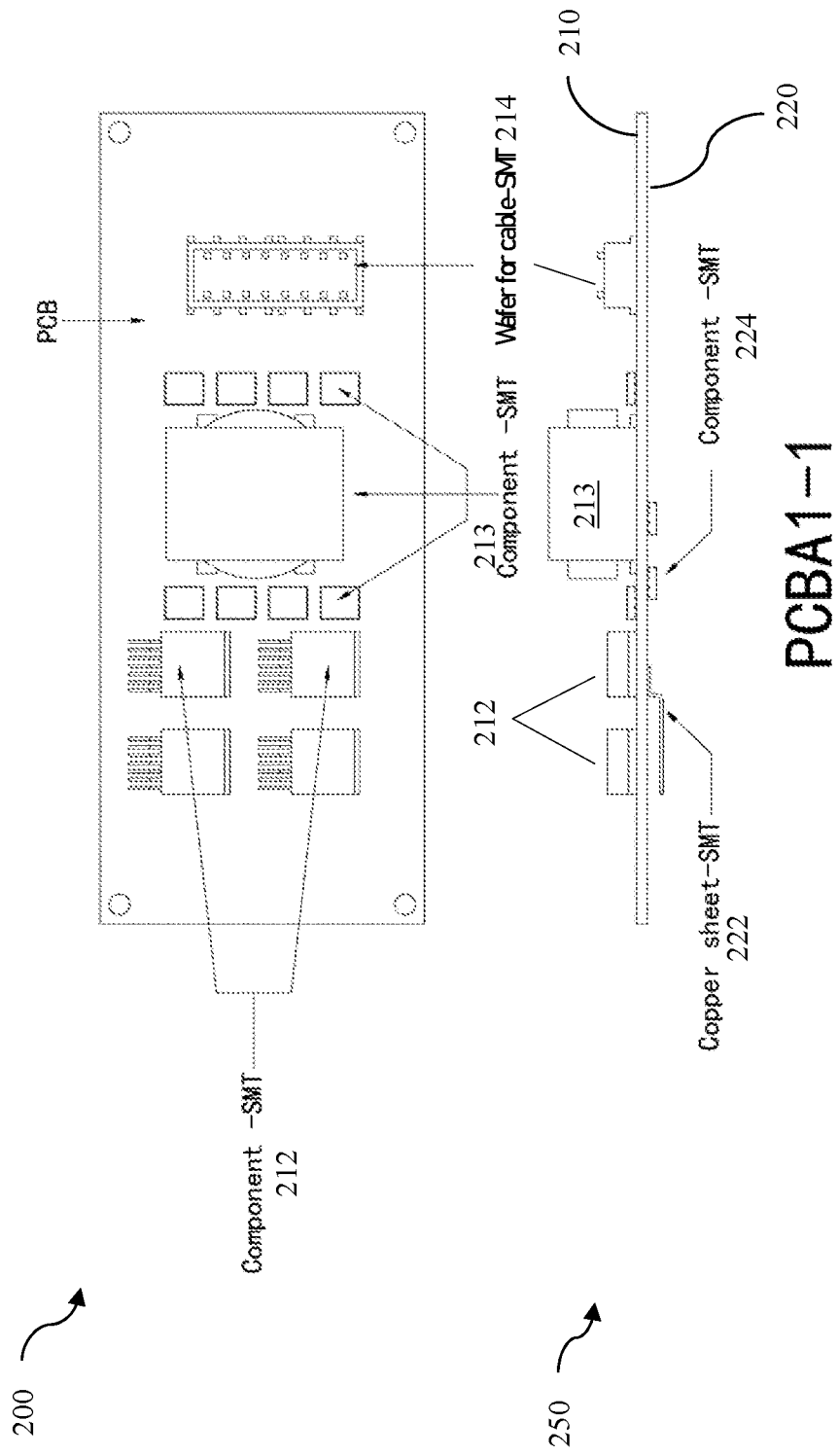
FIG. 2 illustrates a top view and a side view of an example PCBA1 in accordance with various embodiments of the present disclosure.

FIG. 2 is a diagram illustrating a top view 200 and a side view 250 of an example PCBA1 (i.e., PCBA1-1 as shown) in accordance with various embodiments of the present disclosure. PCBA1 may have a first surface 210 and second surface 220 opposite to each other. On the first surface 210 of PCBA1, a plurality of surface mount components may be placed on it, e.g., by use of SMT. The plurality of surface mount components may include a plurality of power switches 212, a transformer 213 (may include other related components) and a cable connection structure 214 (referred to as wafer for cable-SMT) for accommodating cable(s), e.g., the flexible cable described above. On the second surface 220 of the PCBA1, there may be a copper sheet 222 and a plurality of surface mount components 224 mounted, e.g., by use of SMT. The surface mount components 224 may include a controller, a control circuit, a signaling circuit, and so on.

In accordance with an embodiment, the power switches 212 of FIG. 2 may be metal oxide semiconductor field-effect transistor (MOSFET) devices, bipolar junction transistor (BJT) devices, super junction transistor (SJT) devices, insulated gate bipolar transistor (IGBT) devices, gallium nitride (GaN) based power devices and/or the like.

Figure 3:
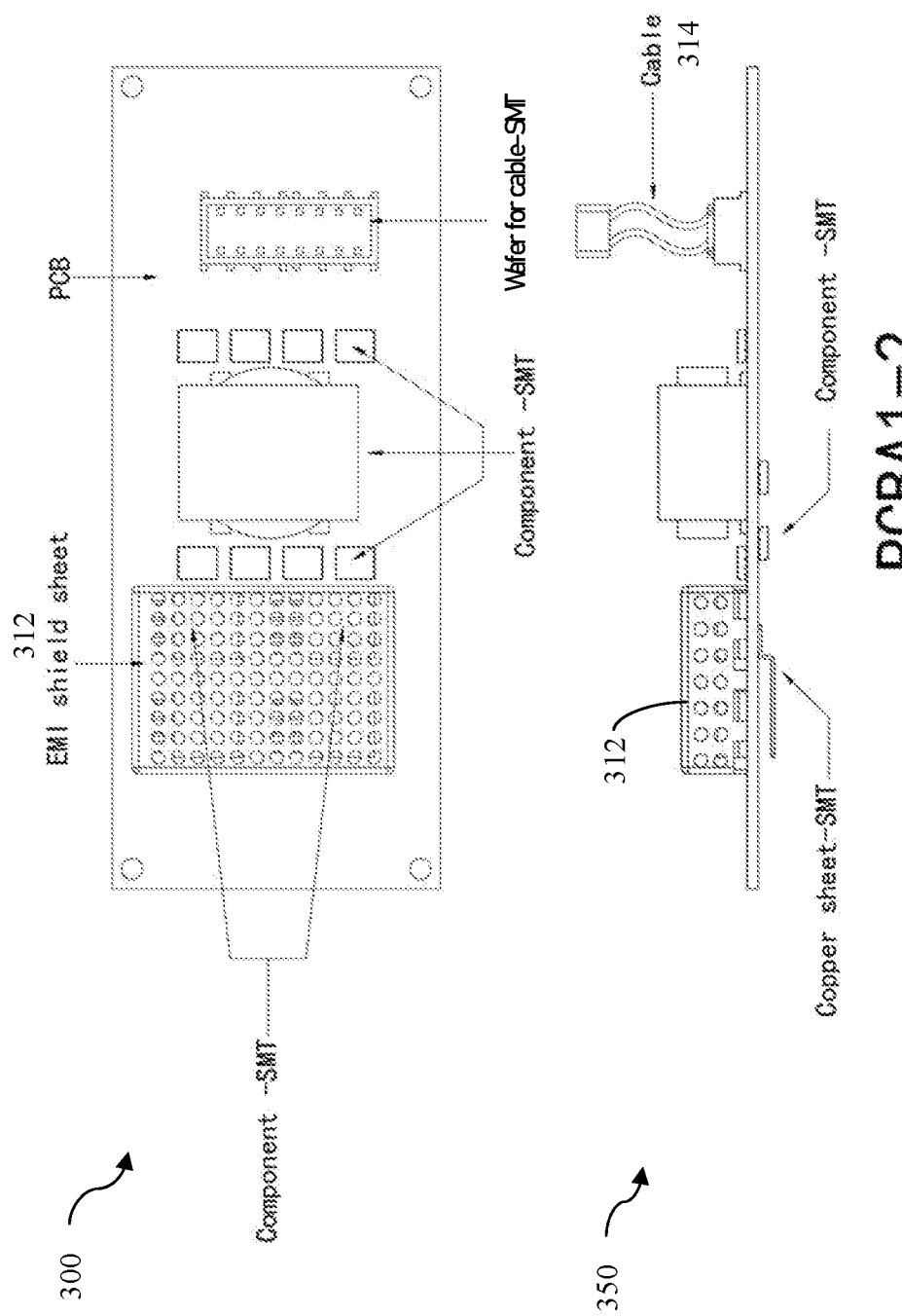
FIG. 3 illustrates a top view and a side view of another example PCBA1 in accordance with various embodiments of the present disclosure.

FIG. 3 is a diagram illustrating a top view 300 and a side view 350 of another example PCBA1 (PCBA1-2 as shown) in accordance with various embodiments of the present disclosure. The configuration/structure of PCBA1-2 shown in FIG. 3 is similar to that shown in FIG. 2 except that an EMI shield sheet 312 is placed over the power switches 212 and a cable 314 is connected with the cable connection structure 214. PCBA1 may be electrically connected to PCBA2 through the cable 314 using the cable connection structure 214.

Figure 4:
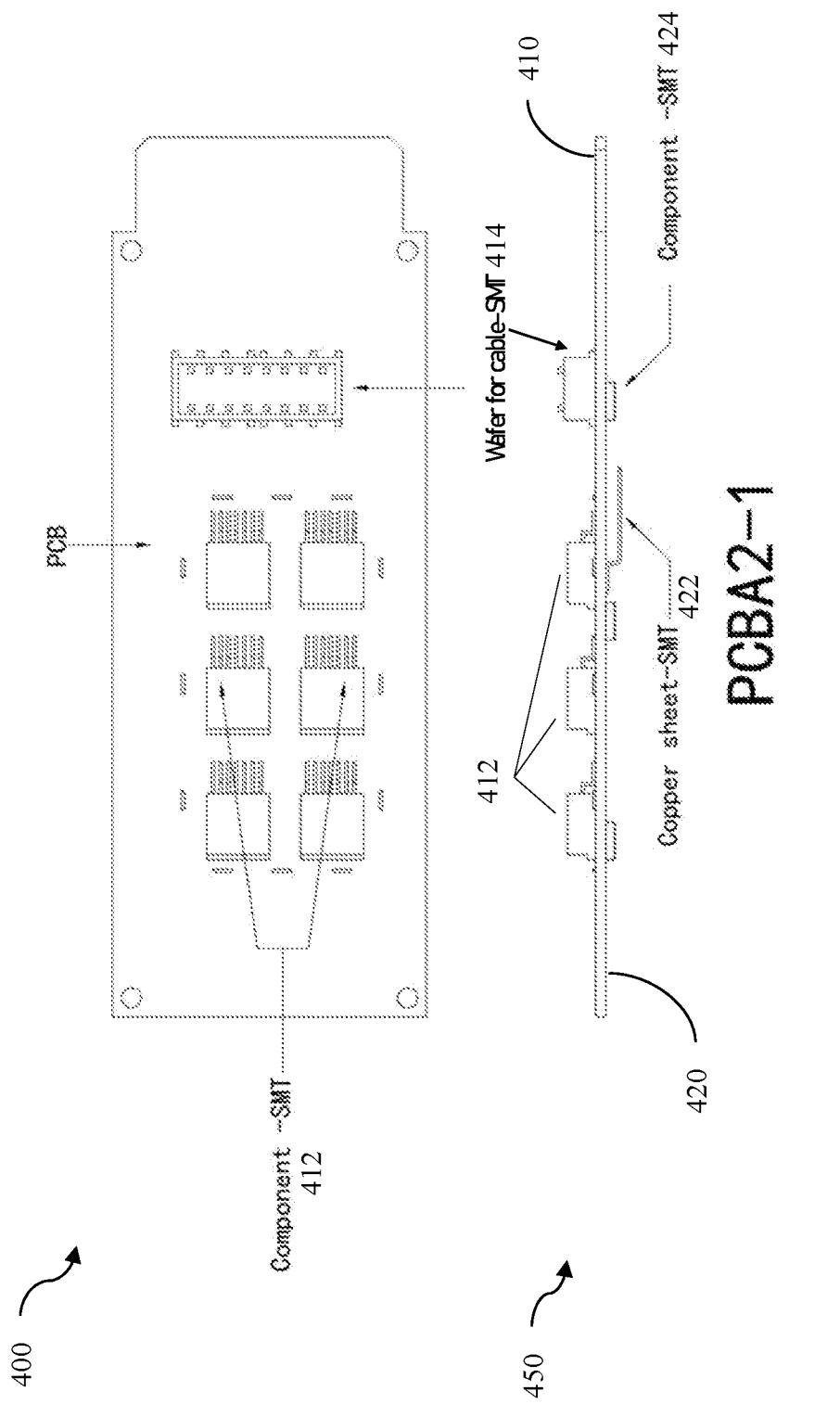
FIG. 4 illustrates a top view and a side view of an example PCBA2 in accordance with various embodiments of the present disclosure.

FIG. 4 is a diagram illustrating a top view 400 and a side view 450 of an example PCBA2 (PCBA2-1) in accordance with various embodiments of the present disclosure. PCBA2 may have a first surface 410 and second surface 420 opposite to each other. On the first surface 410 of PCBA2, a plurality of surface mount components may be placed on it, e.g., by use of SMT. The plurality of surface mount components may include a plurality of power switches 412 and a cable connection structure 414 (wafer for cable-SMT) for accommodating a cable, e.g., the cable 314. On the second surface 420 of the PCBA2, there may be a copper sheet 422 and a plurality of surface mount components 424 mounted, e.g., by use of SMT.

In accordance with an embodiment, the power switches 412 of FIG. 4 may include metal oxide semiconductor field-effect transistor (MOSFET) devices, bipolar junction transistor (BJT) devices, super junction transistor (SJT) devices, insulated gate bipolar transistor (IGBT) devices, gallium nitride (GaN) based power devices and/or the like.

Figure 5:
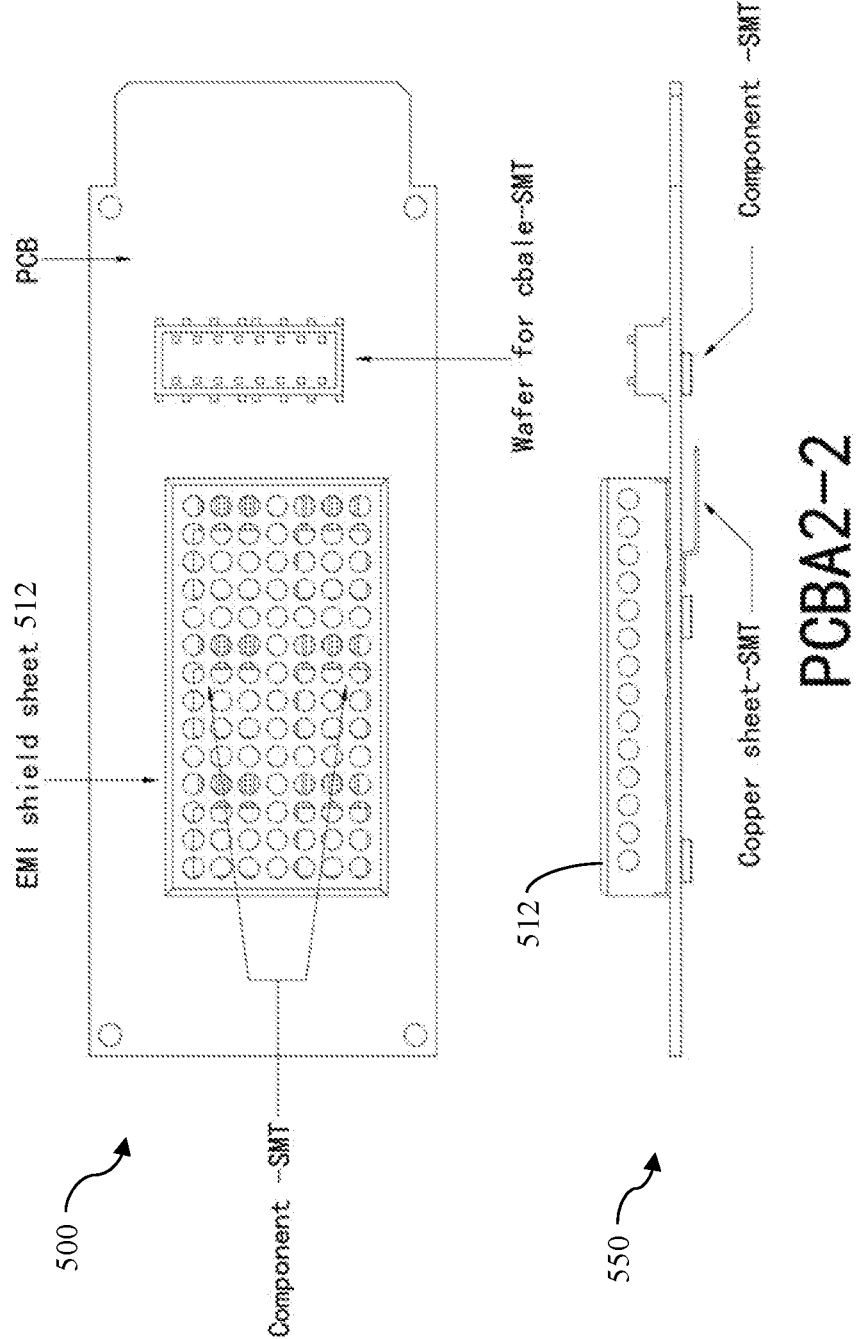
FIG. 5 illustrates a top view and a side view of another example PCBA2 in accordance with various embodiments of the present disclosure.

FIG. 5 is a diagram illustrating a top view 500 and a side view 550 of another example PCBA2 (PCBA2-2) in accordance with various embodiments of the present disclosure. The configuration of PCBA2-2 shown in FIG. 5 is similar to that shown in FIG. 4, except that an EMI shield sheet 512 is placed over the power switches 412.

Figure 6:
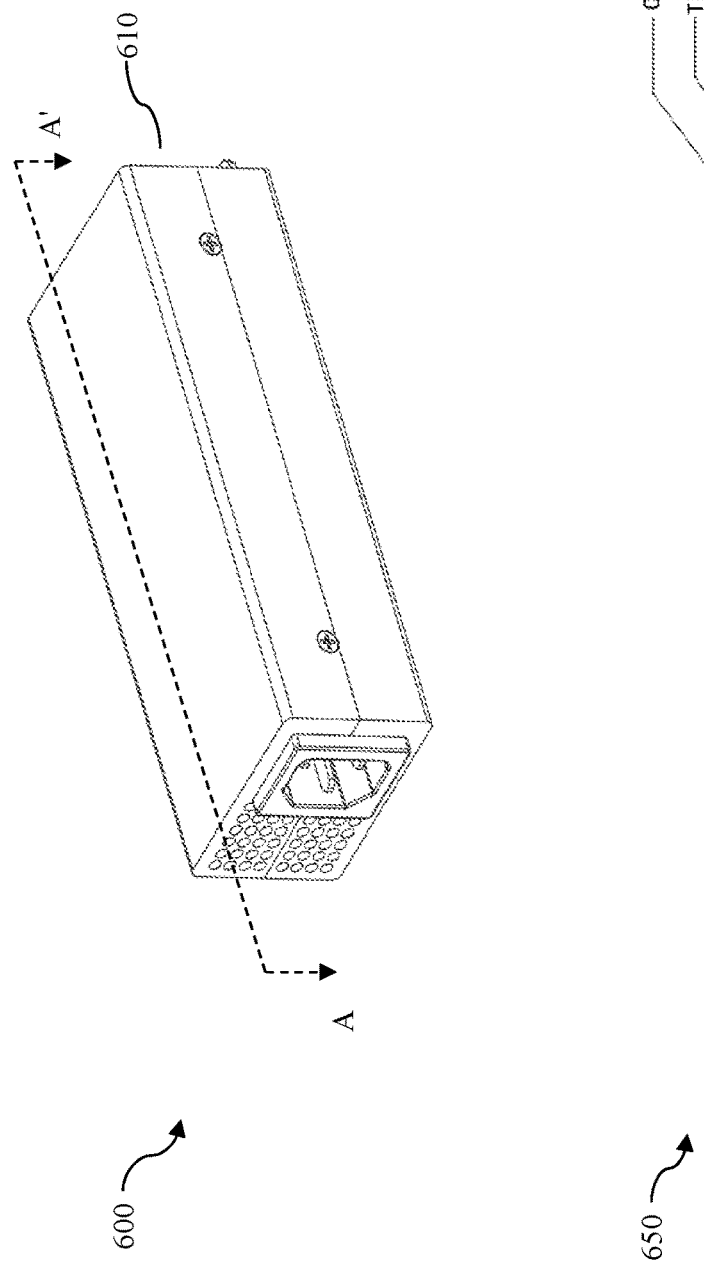
FIG. 6 illustrates a perspective view and a cross sectional view of an example windless power module cooling structure in accordance with various embodiments of the present disclosure.
Figure 6:
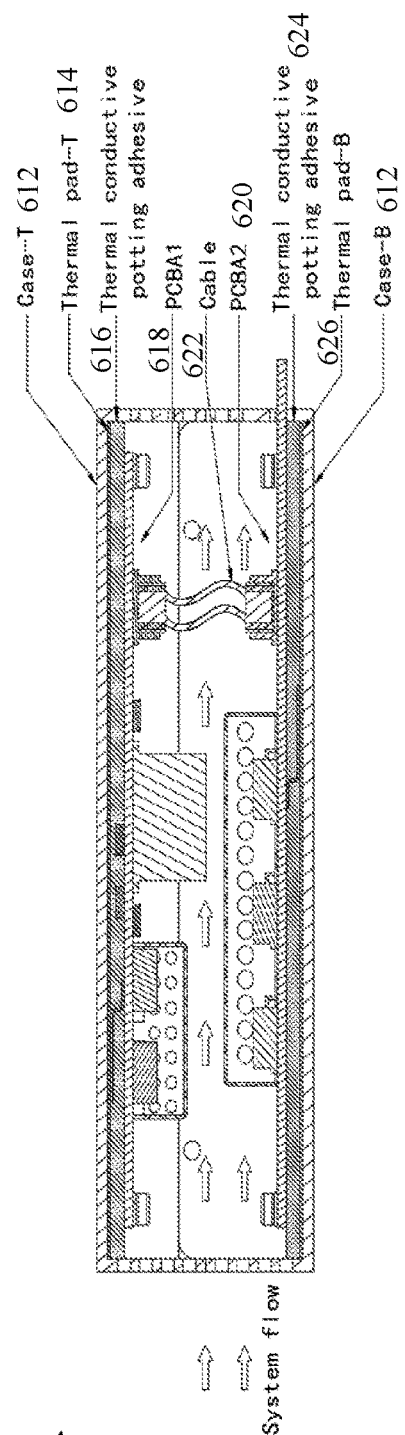

FIG. 6 is a diagram illustrating a perspective view 600 and a cross sectional view 650 of an example windless power module cooling structure 610 in accordance with various embodiments of the present disclosure. The cross sectional view 650 is provided along a cutting line AA'. The windless power module cooling structure 610 may be used for various power supply devices. The example windless power module cooling structure 610 includes a heat dissipation case 612, a top thermal pad 614 (i.e., thermal pad-T), a top thermal conductive potting adhesive layer 616, a PCBA1 618, a PCBA2 620, a cable 622 connected between PCBA1 618 and PCBA2 620, a bottom thermal conductive potting adhesive layer 624, and a bottom thermal pad 626 (i.e., thermal pad-B). The thermal pads and the thermal conductive potting adhesive layers may use various materials that is applicable.

The heat dissipation case 612 may use aluminum, copper or other materials having high thermal conductivity for heat transfer. The heat dissipation case 612 includes a top portion (i.e., case-T) and a bottom portion (i.e., case-B). The top thermal pad 614 is mounted on the top portion (case-T) of the heat dissipation case 612. The top thermal conductive potting adhesive layer 616 is arranged on the top thermal pad 614. PCBA1 618 is arranged on the top thermal conductive potting adhesive layer 616. The bottom thermal pad 626 is mounted on the bottom portion (case-B) of the heat dissipation case 612. The bottom thermal conductive potting adhesive layer 624 is arranged on the bottom thermal pad 626. PCBA2 is arranged on the bottom thermal conductive potting adhesive layer 624. PCBA1 618 may have a structure of the PCBA1 as shown in FIG. 2 or FIG. 3, and may be attached to the top thermal conductive potting adhesive layer 616 at the second surface of the PCBA1 618. PCBA2 620 may have a structure of the PCBA2 as shown in FIG. 4 or FIG. 5, and may be attached to the bottom thermal conductive potting adhesive layer 624 at the second surface of the PCBA2 620.

The cable 622 is connected between PCBA1 618 and PCBA2 620 such that PCBA1 618 and PCBA2 620 are electrically connected. The cable 622 may connect PCBA1 618 and PCBA2 620 using the cable connection structures of PCBA1 618 and PCBA2 620 (as described above). In this example, a gap between PCBA1 618 and PCBA2 620 is created that allows system airflow (e.g., as shown by arrows in FIG. 6) to pass through the gap between PCBA1 and PCBA2, thus dissipating heat from power generating components mounted on the PCBs. In some embodiments, the PCBA1 may be mounted to the bottom case-B, and PCBA2 may be mounted to the top case-T.

Figure 7:
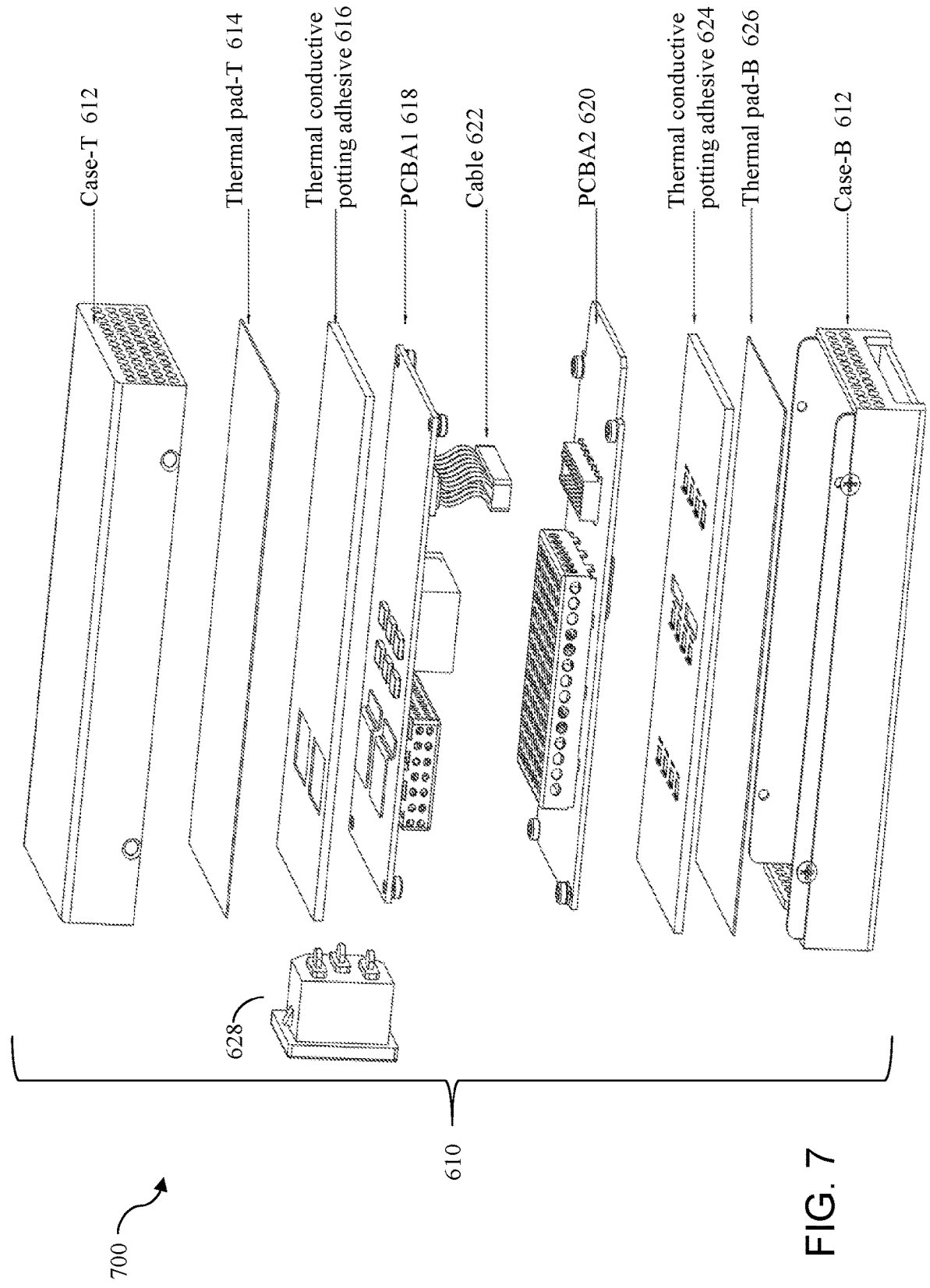
FIG. 7 illustrates an example exploded view of the windless power module cooling structure shown in FIG. 6 in accordance with various embodiments of the present disclosure.

FIG. 7 is a diagram illustrating an example exploded view 700 of the windless power module cooling structure 610 shown in FIG. 6 in accordance with various embodiments of the present disclosure. The elements/components in FIG. 7 are basically similar to those described above with respect to FIG. 6, and hence are not discussed herein with further detail. Additionally, FIG. 7 shows an interface 628 configured for connecting the windless power module cooling structure 610 to another device, e.g., a battery.

Figure 8:
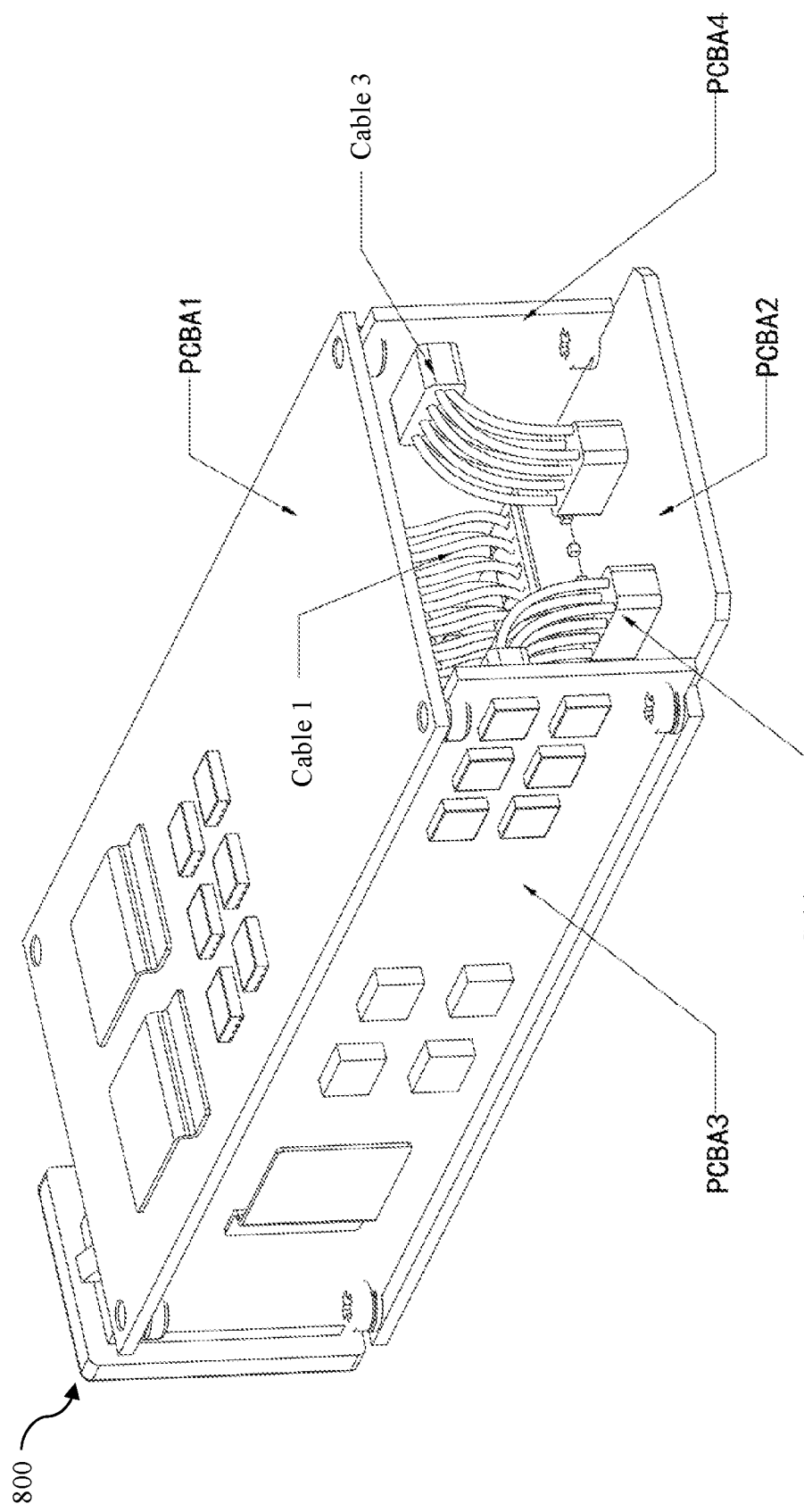
FIG. 8 illustrates a perspective view of a portion of another example windless power module cooling structure in accordance with various embodiments of the present disclosure.

FIG. 8 is a diagram illustrating a perspective view of a portion of another example windless power module cooling structure 800 in accordance with various embodiments of the present disclosure, highlighting PCBAs in the windless power module cooling structure 800. The windless power module cooling structure 800 shown in FIG. 8 is similar to the windless power module cooling structure shown in FIGS. 6-7, except that more PCBs are used in the windless power module cooling structure 800, which enables to better transfer heat to the heat dissipation case. The example windless power module cooling structure 800 as illustrated in FIG. 8 includes four PCBs, i.e., PCBA1, PCBA2, PCBA3 and PCBA4. PCBA1 and PCBA2 may have the same structures and locations, respectively, as illustrated in FIGS. 6-7. PCBA3 and PCBA4 are added, and are located on the left and right sides of the windless power module cooling structure 800, as an example. Cable 1 is similar to the cable 622 of FIGS. 6-7, connecting PCBA1 and PCBA2. Cable 2 is a cable connected between PCBA3 and PCBA2 for electrically connecting PCBA3 and PCBA2. Cable 3 is a cable connected between PCBA4 and PCBA2 for electrically connecting PCBA4 and PCBA2. PCBA3 and PCBA4 may each be configured to include one or more components mounted, e.g., heat generating components or other applicable components.

As shown in FIG. 8, PCBA3 is connected between a first edge region of PCBA1 and a first edge region of PCBA2. PCBA4 is connected between a second edge region of PCBA1 and a second edge region of PCBA2. PCBA3 forms a first sidewall of the windless power module cooling structure 800 between PCBA1 and PCBA2. PCBA4 forms a second sidewall of the windless power module cooling structure 800 between PCBA1 and PCBA2. PCBA3 and PCBA4 may be referred to as sidewall PCBAs of the windless power module cooling structure 800. PCBA1, PCBA2, PCBA3 and PCBA4 form a space within the windless power module cooling structure 800, allowing system airflow to pass.

Figure 9:
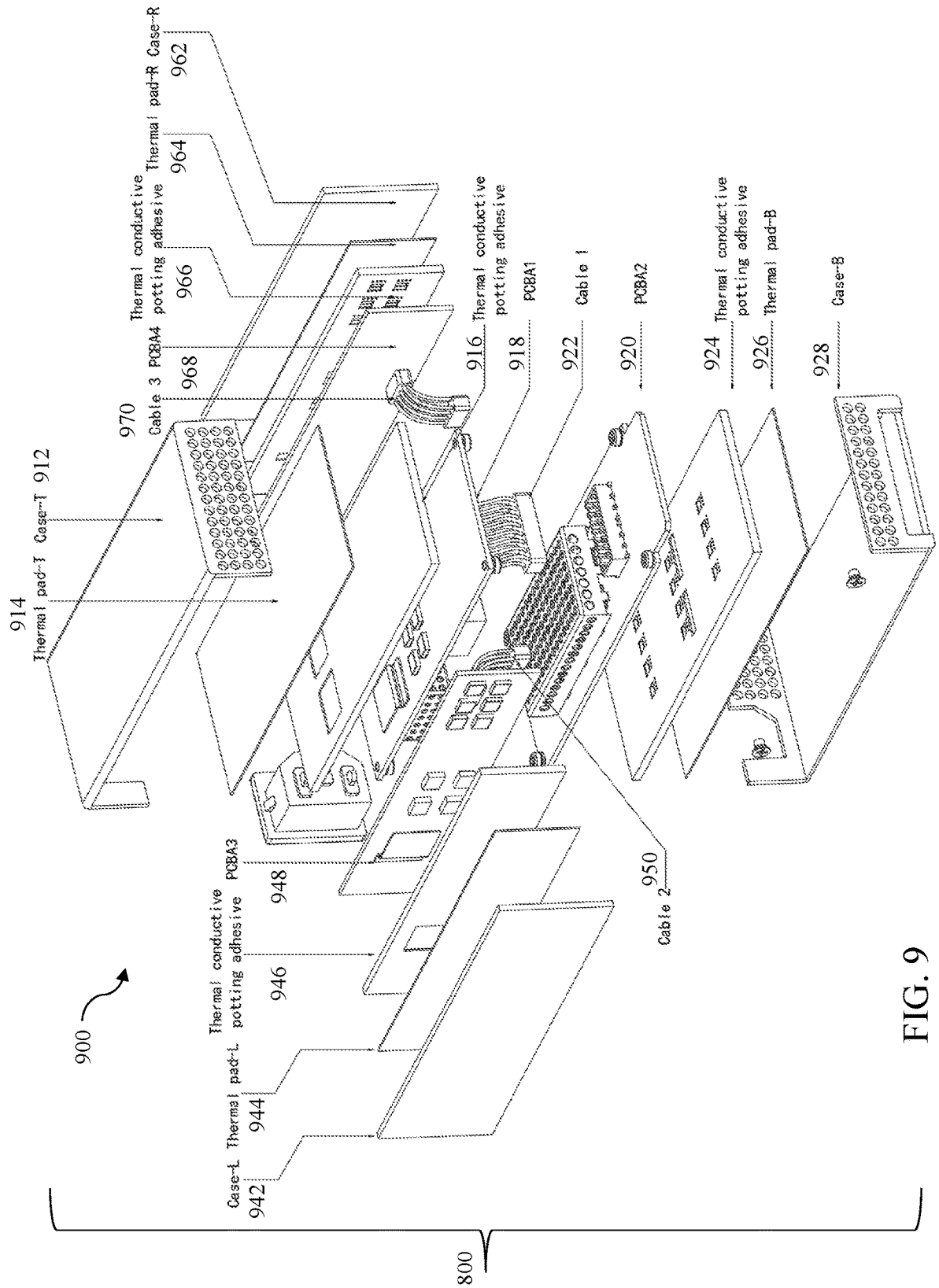
FIG. 9 illustrates an example exploded view of the windless power module cooling structure shown in FIG. 8 in accordance with various embodiments of the present disclosure.

FIG. 9 is a diagram of an example exploded view 900 of the windless power module cooling structure 800 in FIG. 8 in accordance with various embodiments of the present disclosure. As shown in FIG. 9, from top to bottom, similar to the windless power module cooling structure 610 in FIGS. 6-7, the windless power module cooling structure 800 includes a top heat dissipation case 912 (case-T), a top thermal pad 914 (thermal pad-T), a top thermal conductive potting adhesive layer 916, a PCBA1 918, a PCBA2 920, a cable 922 (Cable 1) for connecting PCBA1 918 and PCBA2 920, a bottom thermal conductive potting adhesive layer 924, a bottom thermal pad 926 (thermal pad-B), and a bottom heat dissipation case 928 (case-B). The windless power module cooling structure 800 further includes a left-side heat dissipation case 942 (case-L), a left-side thermal pad 944 (thermal pad-L), a left-side thermal conductive potting adhesive layer 946, a left-side PCBA3 948, and a cable 950 (cable 2) connecting PCBA3 948 and PCBA2 920. The windless power module cooling structure 800 also includes a right-side heat dissipation case 962 (case-R), a right-side thermal pad 964 (thermal pad-R), a right-side thermal conductive potting adhesive layer 966, PCBA4 968, and a cable 970 (cable 3) connecting PCBA4 968 and PCBA2 920. The PCBA2 920 may include cable connection structure(s), e.g., cable sockets, for accommodating cables to connect to other PCBAs. The left-side heat dissipation case 942 and the right-side heat dissipation case 962 may also be referred to as sidewalls of the heat dissipation case of the windless power module cooling structure 800.

In this example, the windless power module cooling structure 800 may be viewed to include four portions: a top portion (top PCB), a bottom portion (bottom PCB), a left side portion (sidewall PCB) and a right side portion (sidewall PCB). Each of the four portions includes at least a PCBA, a thermal conductive potting adhesive layer, a thermal pad and a heat dissipation case. The thermal conductive potting adhesive layer is disposed between the PCBA and the thermal pad, and the thermal pad is disposed on the heat dissipation case. For example, the top portion includes the components 912-918, and may include other applicable components/elements. The bottom portion includes components 920-928, and may include other applicable components/elements. The left side portion includes components 942-948, and may include other applicable components/elements. The right side portion includes components 962-968, and may include other applicable components/elements.

Figure 10:
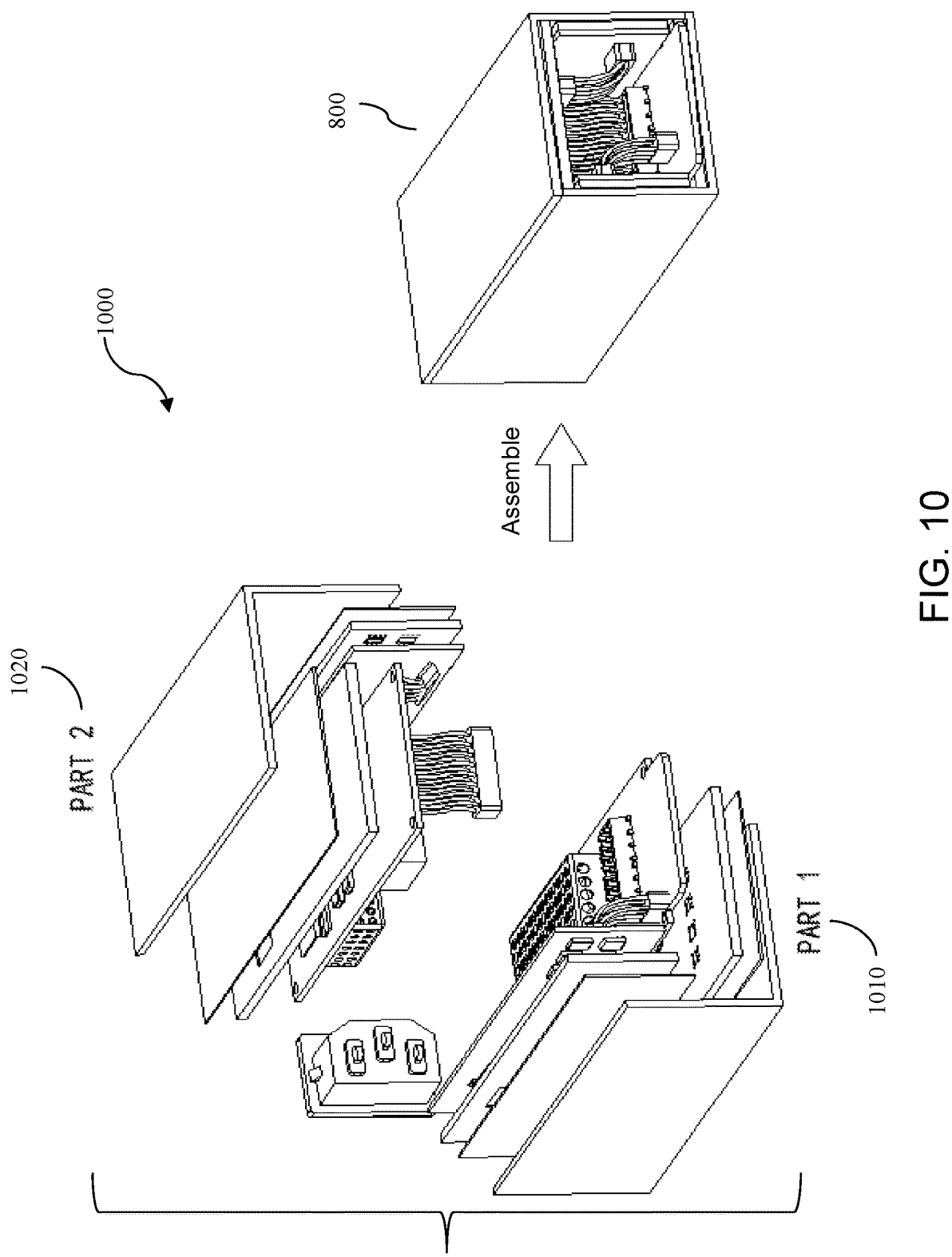
FIG. 10 illustrates an example assembly view of the windless power module cooling structure shown in FIG. 8 in accordance with various embodiments of the present disclosure.

To facilitate assembly, in some embodiments, the windless power module cooling structure 800 in FIGS. 8-9 may be divided into two parts, i.e., a first part and a second part. As an example, the first part may include the top portion and the left side portion, and the second part may include the bottom portion and the right side portion. As another example, the first part may include the top portion and the right side portion, and the second part may include the bottom portion and the left side portion. The first part and the second part may each be assembled first and then they are assembled together to obtain the windless power module cooling structure 800. FIG. 10 provides an assembly example.

FIG. 10 is a diagram illustrating an example assembly view 1000 of the windless power module cooling structure 800 in accordance with various embodiments of the present disclosure. In this example, the windless power module cooling structure 800 is divided into the first part and the second part, i.e., part 1 1010 and part 2 1020, for assembly. Part 1 1010 includes the bottom portion and the left side portion. Part 2 1020 includes the top portion and the right side portion. The plurality of PCBs is installed in the part 1010 and the part 1020, respectively. Once the two parts are ready (assembled), the windless power module cooling structure 800 is assembled as shown in FIG. 10.

Figure 11:
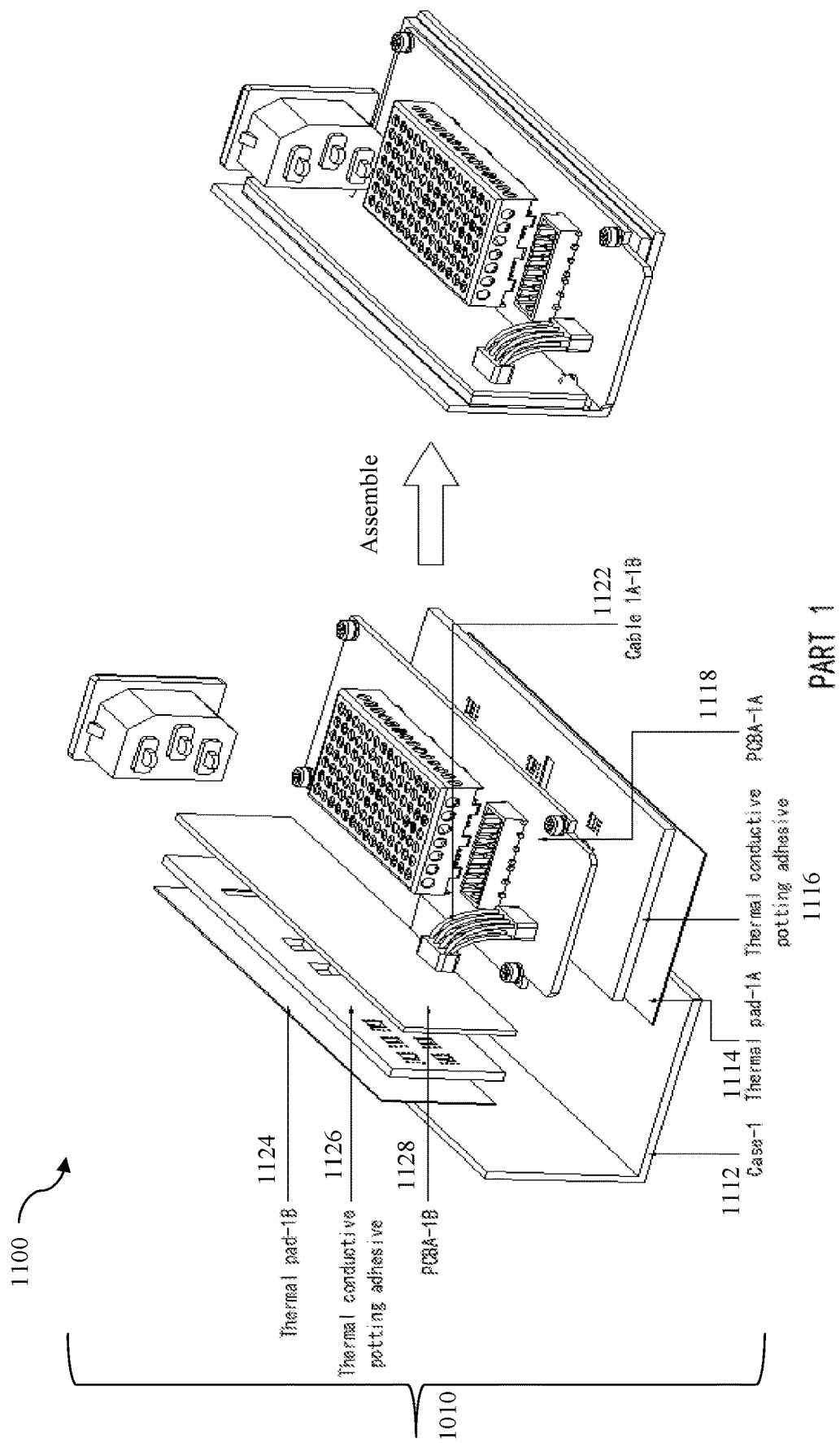
FIG. 11 illustrates an example assembly view of a first part of the windless power module cooling structure shown in FIG. 8 in accordance with various embodiments of the present disclosure.

FIG. 11 is a diagram illustrating an example assembly view 1100 of an example part 1 (the part 1 1010) of the windless power module cooling structure 800 shown in FIGS. 8-10 in accordance with various embodiments of the present disclosure. FIG. 11 shows the first part of the windless power module cooling structure 800, as an example. For description purposes only, some components shown in FIGS. 8-9 are renamed in FIG. 11. The part 1 includes a heat dissipation case 1112 (case-1), a bottom PCB (corresponding to the bottom portion) and a sidewall PCB (corresponding to the left side portion) as shown in FIG. 11. The bottom PCB includes a thermal pad 1114 (thermal pad-1A), a thermal conductive potting adhesive 1116, and a PCBA 1118 (PCBA-1A), which are in the bottom portion of the windless power module cooling structure 800 in this example. The sidewall PCB includes a thermal pad 1124 (thermal pad-1B), a thermal conductive potting adhesive 1126, and a PCBA 1128 (PCBA-1B), which are in the left side portion of the windless power module cooling structure 800 in this example. A cable 1122 (cable 1A-1B) is connected between PCBA 1118 and PCBA 1128. These components and other components if applicable are assembled to obtain an assembled part 1, as shown in FIG. 11.

Figure 12:
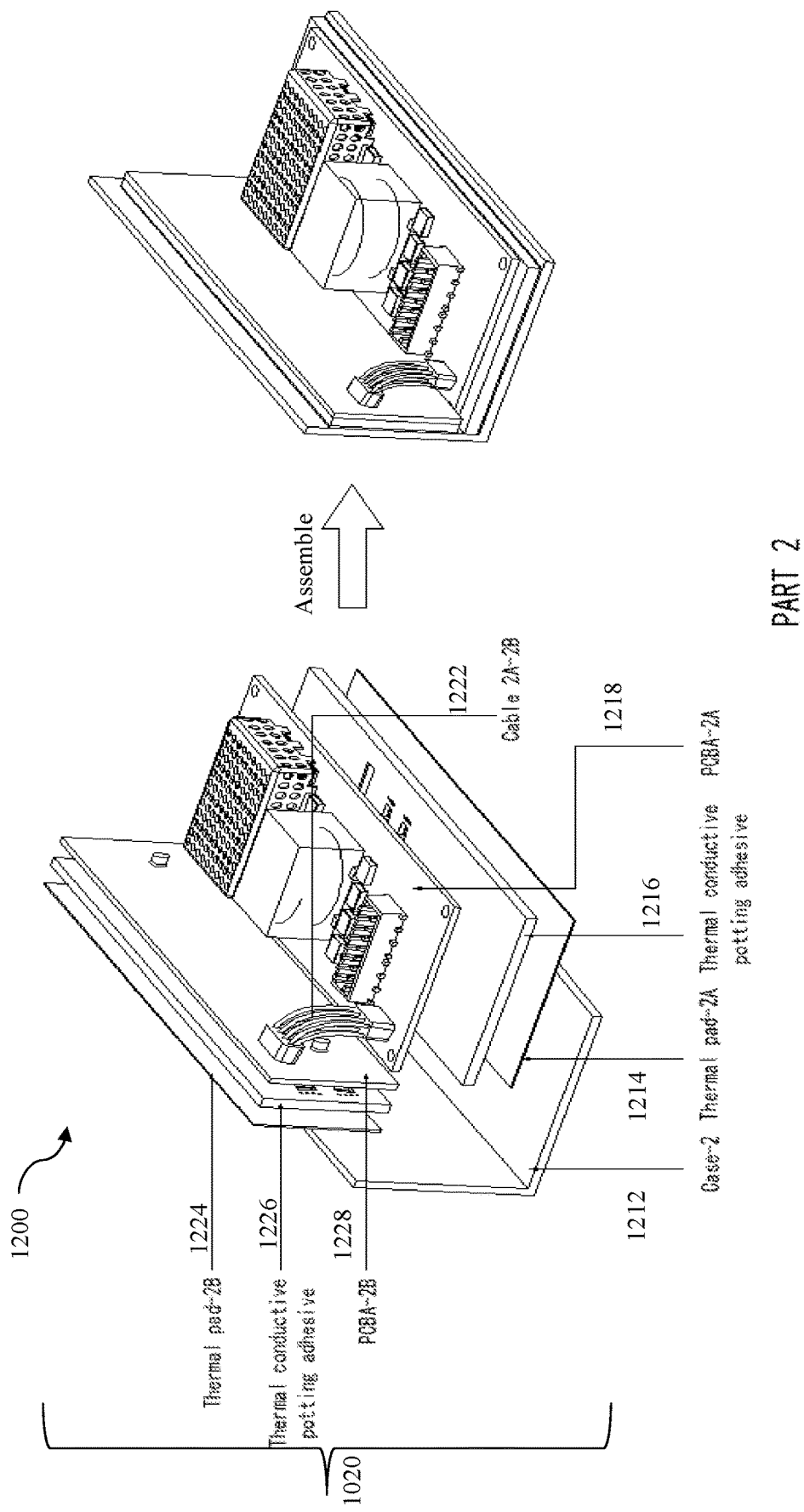
FIG. 12 illustrates an example assembly view of a second part of the windless power module cooling structure shown in FIG. 8 in accordance with various embodiments of the present disclosure.

FIG. 12 is a diagram illustrating an example assembly view 1200 of an example part 2 (the part 2 1020) of the windless power module cooling structure 800 shown in FIGS. 8-10 in accordance with various embodiments of the present disclosure. FIG. 12 shows the second part of the windless power module cooling structure 800, as an example. For description purposes only, some components shown in FIGS. 8-9 are renamed in FIG. 12. The part 2 includes a heat dissipation case 1212 (case-2), a top PCB (corresponding to the top portion) and a sidewall PCB (corresponding to the right side portion). The top PCB includes a thermal pad 1214 (thermal pad-2A), a thermal conductive potting adhesive 1216, and a PCBA 1218 (PCBA-2A), which are in the top portion of the windless power module cooling structure 800 in this example. The sidewall PCB includes a thermal pad 1224 (thermal pad-2B), a thermal conductive potting adhesive 1226, and a PCBA 1228 (PCBA-2B), which are in the right side portion of the windless power module cooling structure 800 in this example. A cable 1222 (cable 2A-2B) is connected between PCBA 1218 and PCBA 1228. These components and other components if applicable are assembled to obtain an assembled part 2, as shown in FIG. 12. The assembled part 1 and part 2 may then be assembled to obtain a windless power module cooling structure as described above.

Figure 13:
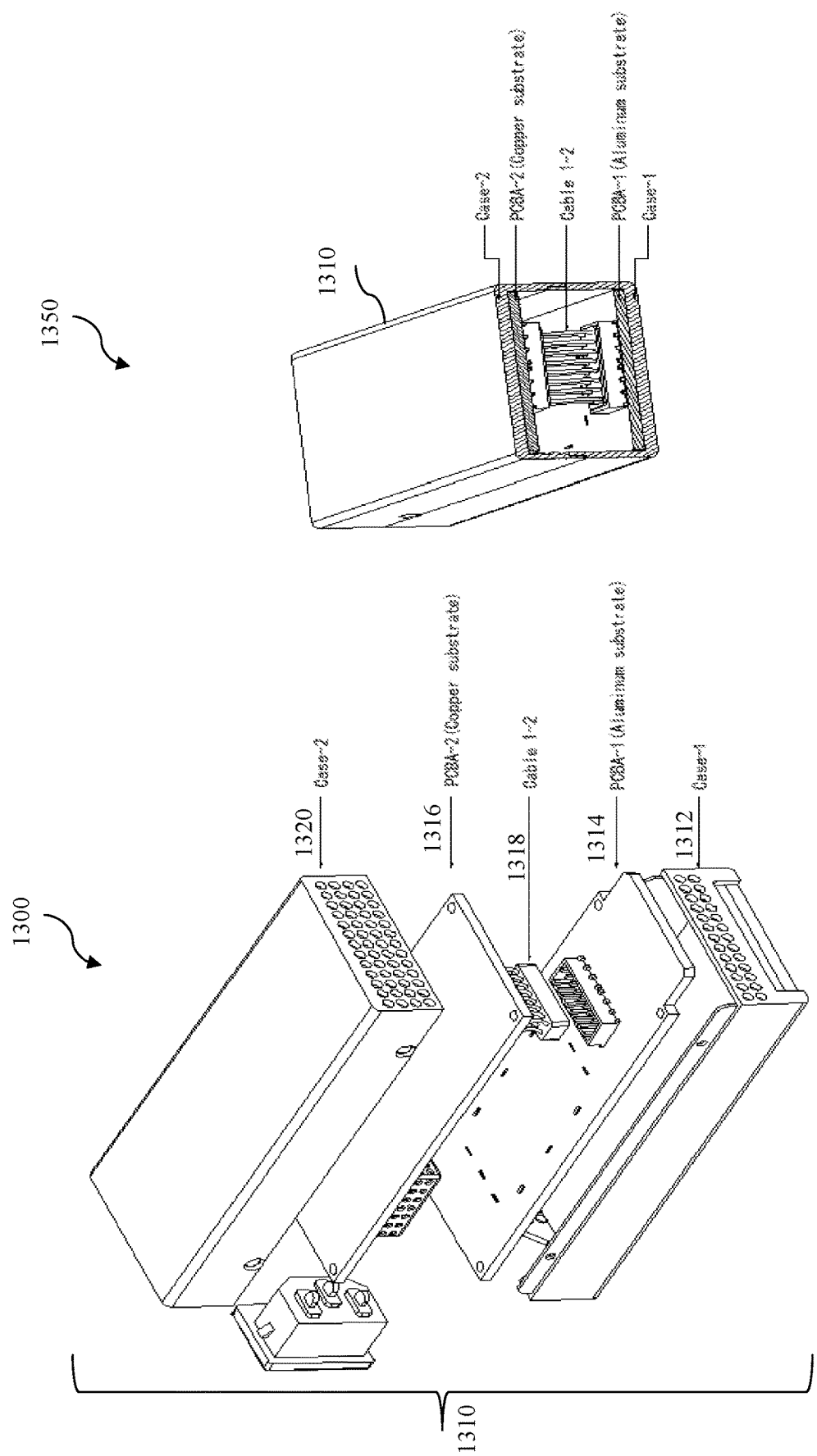
FIG. 13 illustrates an exploded view and a perspective view of another example windless power module cooling structure in accordance with various embodiments of the present disclosure.

FIG. 13 is a diagram illustrating an exploded view 1300 and a perspective view 1350 of another example windless power module cooling structure 1310 in accordance with various embodiments of the present disclosure. The windless power module cooling structure 1310 shown in FIG. 13 is similar to the windless power module cooling structure 610 shown in FIGS. 6-7, except that, in order to better transfer heat from power devices to the heat dissipation case, the PCBA may have an aluminum or copper substrate, which is mounted directly onto the heat dissipation case in order to reduce thermal resistance and achieve efficient heat dissipation. In this case, the windless power module cooling structure 1310 may not include the thermal pad and the thermal conductive potting adhesive layer described above. As shown, the windless power module cooling structure 1310 includes a bottom heat dissipation case 1312 (case-1), a PCBA-1 1314 having an aluminum substrate, a PCBA-2 1316 having a copper substrate, a cable 1316 (cable 1-2) connected between the PCBA-1 1314 and the PCBA-2 1316, and a top heat dissipation case 1320 (case-2). The PCBA-1 1314 is directly mounted to the case-1 1312. The PCBA-2 1316 is directly mounted to the case-2 1320. In some examples, the PCBA-1 1314 and the PCBA-2 1316 each may have a cooper substrate, or each have an aluminum substrate. In another example, the PCBA-1 1314 may have a copper substrate, and the PCBA-2 1316 may have an aluminum substrate. Other applicable metal substrate may also be used in order to transfer heat from power devices to the heat dissipation case. The perspective view 1350 shows the windless power module cooling structure 1310 with those components 1312-1320 assembled.

The above embodiment of utilizing the copper or aluminum substrate is not limited to the case of having two PCBAs in a windless power module cooling structure. It may also be used for multiple-PCBA structures in the form of aluminum or copper substrates, e.g., the windless power module cooling structure 800 in FIGS. 8-9. The PCBAs having meal substrate are mounted on the heat dissipation case to reduce thermal resistance.

Figure 14:
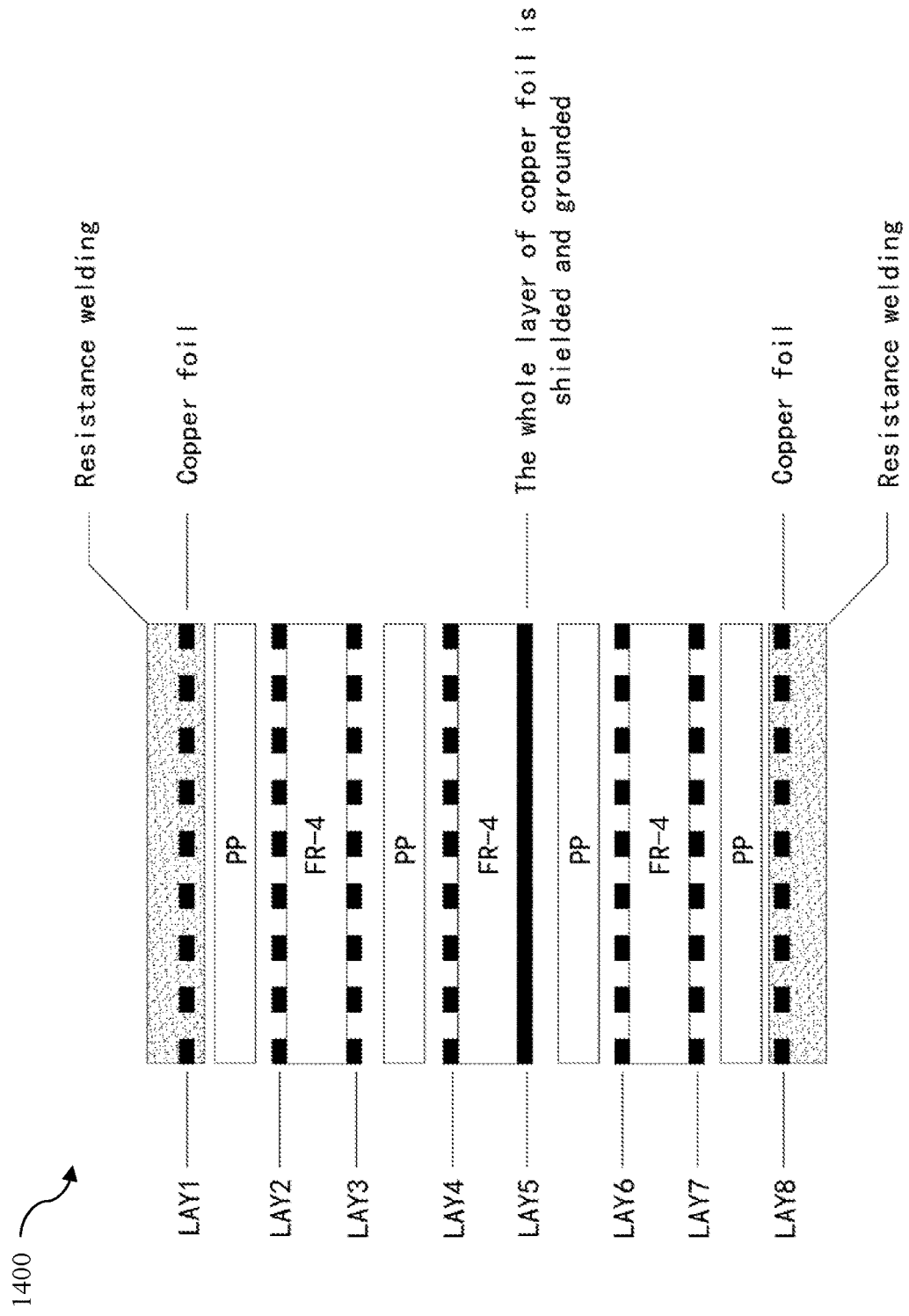
FIG. 14 illustrates a cross section view of an example PCB in accordance with various embodiments of the present disclosure.

FIG. 14 is a diagram of a cross section view of an example PCB 1400 in accordance with various embodiments of the present disclosure. The PCB 1400 may include resistance welding layers on the top and bottom, a plurality of copper foil layers (i.e., LAY1-LAY8), insulating material layers (prepreg or PP) and flame retardant (FR)-4 layers as shown in FIG. 14. In this example, the PCB 1400 may not only utilize the conventionally used shield sheet, but also utilize an entire layer of copper foil in the PCB as a shield layer. The shield layer is grounded. That is, shielding of the PCB may be provided by use of not only shield sheet(s), but also copper foil layer(s). As an example, the copper foil layer LAY5 may be shielded and grounded.

Figure 15A:
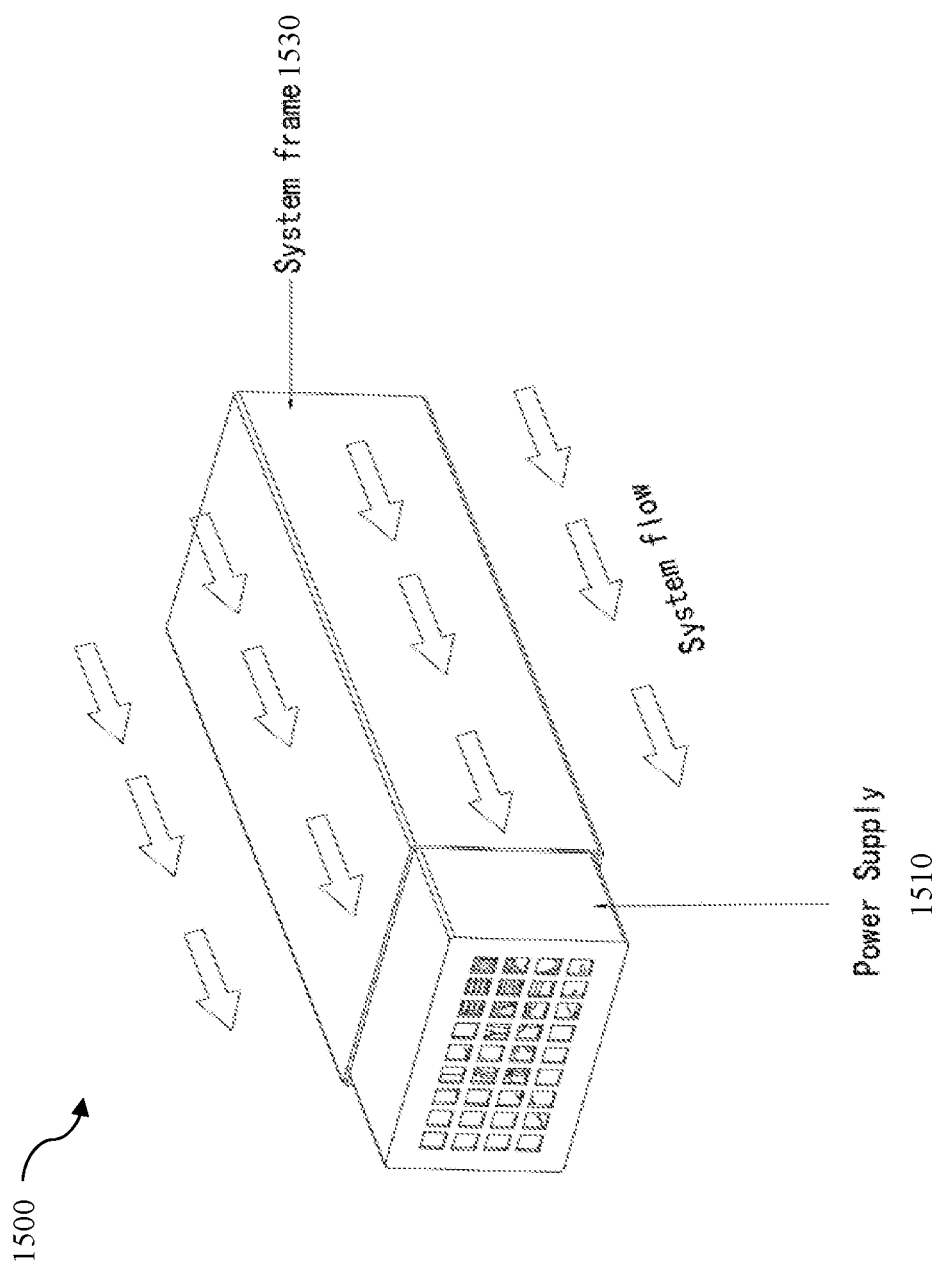
FIG. 15A and FIG. 15B illustrate an example conventional windless power supply system.
Figure 15B:
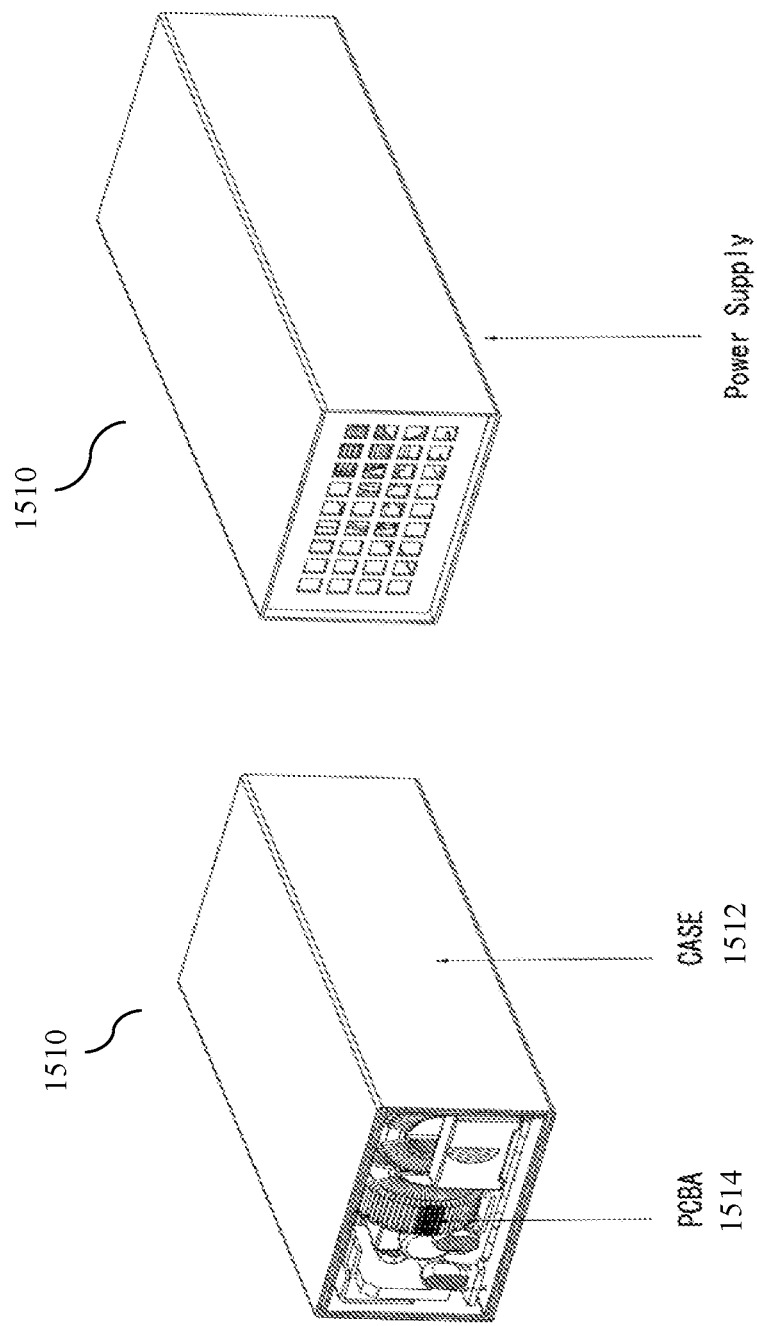

As discussed above, conventionally, the primary heat dissipation path of windless power supplies is from the heat-generating devices to the heat dissipation case, and heat is exchanged with the surrounding air through the large exterior area of the heat dissipation case. However, conventionally, in IT equipment system, power supply modules are often wrapped and fixed by use of sheet metal frame part(s), which prevents the circulating air in the information technology (IT) equipment system from flowing through the exterior surface of the power supply module case, and consequently reduces the efficiency of heat exchange between the heat dissipation case and the system environment, affecting the heat dissipation efficiency. FIGS. 15A and 15B show such an example.

FIG. 15A is a schematic diagram of an example conventional windless power supply system 1500. The power supply system 1500 includes a power supply 1510 and a system frame 1530 housing the power supply 1510. The arrows in FIG. 15A indicate the direction of the system airflow.

FIG. 15B is a schematic diagram showing the power supply 1510 separate from the system frame 1530. The power supply 1510 may include a case 1512 housing components, e.g., a PCBA 1514. When assembled, the power supply 1510 is wrapped around by the case system frame 1530, and thus the system airflow is unable to pass through the exterior surface of the power supply 1510, affecting heat exchange between the heat dissipation case 1532 and the system environment. It is desirable that the housing of a PCB, e.g., a solder mask defined (SMD) PCB, may be designed to make better use of the system airflow within the system frame.

Embodiments of the present disclosure provide a power supply structure having its own heat dissipation channels in order to make better use of the system air for heat dissipation.

The embodiments of the present disclosure include the following technical solution: a windless power module heat dissipation/cooling structure is provided that includes an external heat dissipation case, an internal heat dissipation case (or referred to as inner shell), PCBA1, PCBA2, PCBA3, PCB4 and thermally conductive cross-section materials. The external heat dissipation case and the internal heat dissipation case may use aluminum, copper or other materials having high thermal conductivity to provide heat transfer performance. The PCBAs are multilayer PCBs, and power devices (e.g., power switches) are assembled to the PCBs. The power devices may be assembled to the PCBs using the SMT technique to take advantage of the larger heat dissipation area of the PCBs for heat transferring. A PCB may have at least 4 layers, and may use a copper foil that is 2 Oz in thickness in order to provide heat transfer performance. As an example, the PCB may have layers similar to those illustrated in FIG. 14. The internal and external heat dissipation cases have large heat sink areas, and there is a central ventilation channel in the internal heat dissipation case, so that the system airflow can be used to dissipate heat efficiently.

Figure 16:
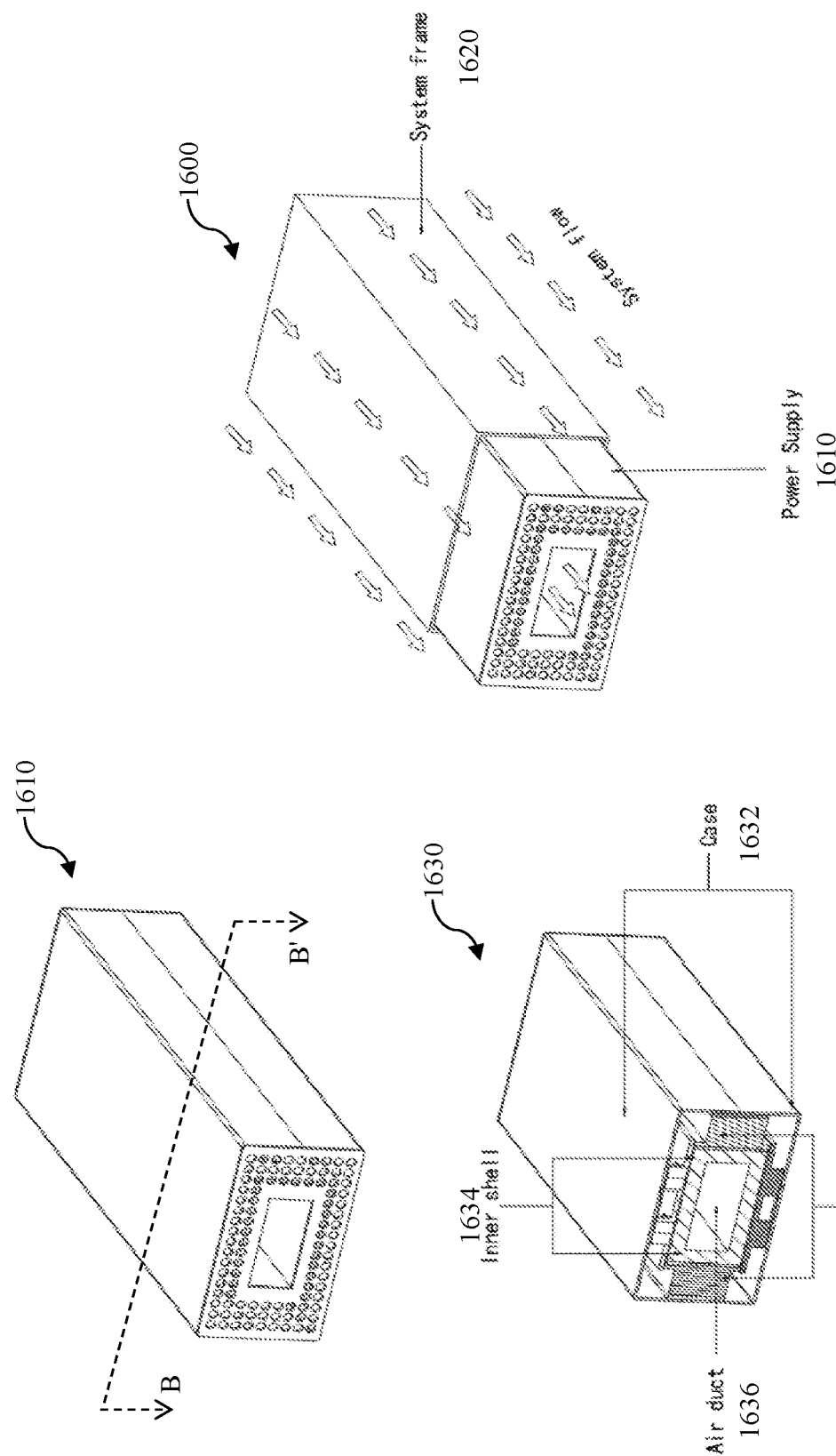
FIG. 16 illustrates an example power supply system having a windless power module cooling structure with an enhanced heat dissipation capability in accordance with various embodiments of the present disclosure.

FIG. 16 is a diagram of an example power supply system 1600 with a windless power module cooling structure having the enhanced heat dissipation capability in accordance with various embodiments of the present disclosure. The power supply system 1600 includes a power supply 1610, and a system frame 1620 housing the power supply 1610 and other applicable component(s). The power supply 1610 may have a windless power module cooling structure 1630, of which a cross sectional view of the windless power module cooling structure 1630 along line BB' is also shown in FIG. 16. As shown, the windless power module cooling structure 1630 includes a case 1632 (i.e., the external heat dissipation case), a PCBA 1638, and an inner shell 1634 (i.e., the internal heat dissipation case) in the middle of the windless power module cooling structure 1630. The case 1632 includes a top surface, a bottom surface, a left side surface and a right side surface, forming an internal space within the case.

The inner shell 1634 includes a top shell/surface, a bottom shell/surface, a left side shell/surface and a right side shell/surface, forming the air duct 1636 extending within the inner shell 1634 along a front-rear direction of the inner shell 1634. It is appreciated that the inner shell 1634 with the air duct 1636 is arranged in the windless power module cooling structure 1630 along the direction of the system airflow, e.g., the direction as shown by the arrows in FIG. 16. As shown, the top, bottom, left side and right side surfaces of the inner shell 1634 face, respectively, the top, bottom, left side and right side surfaces of the case 1632, such that the air duct 1636 extend along a front-rear direction of the case 1632.

The PCBA 1638 may include one or more PCBAs, and have a structure similar to one of those described above, e.g., in FIG. 6, or FIG. 8. The inner shell 1634 may be mounted to the PCBA 1638. As an example, the inner shell 1634 may be mounted to one or more PCBAs mounted in the case 1632. With such a structure, the system airflow can pass through the air duct 1636 to dissipate heat efficiently.

Figure 17:
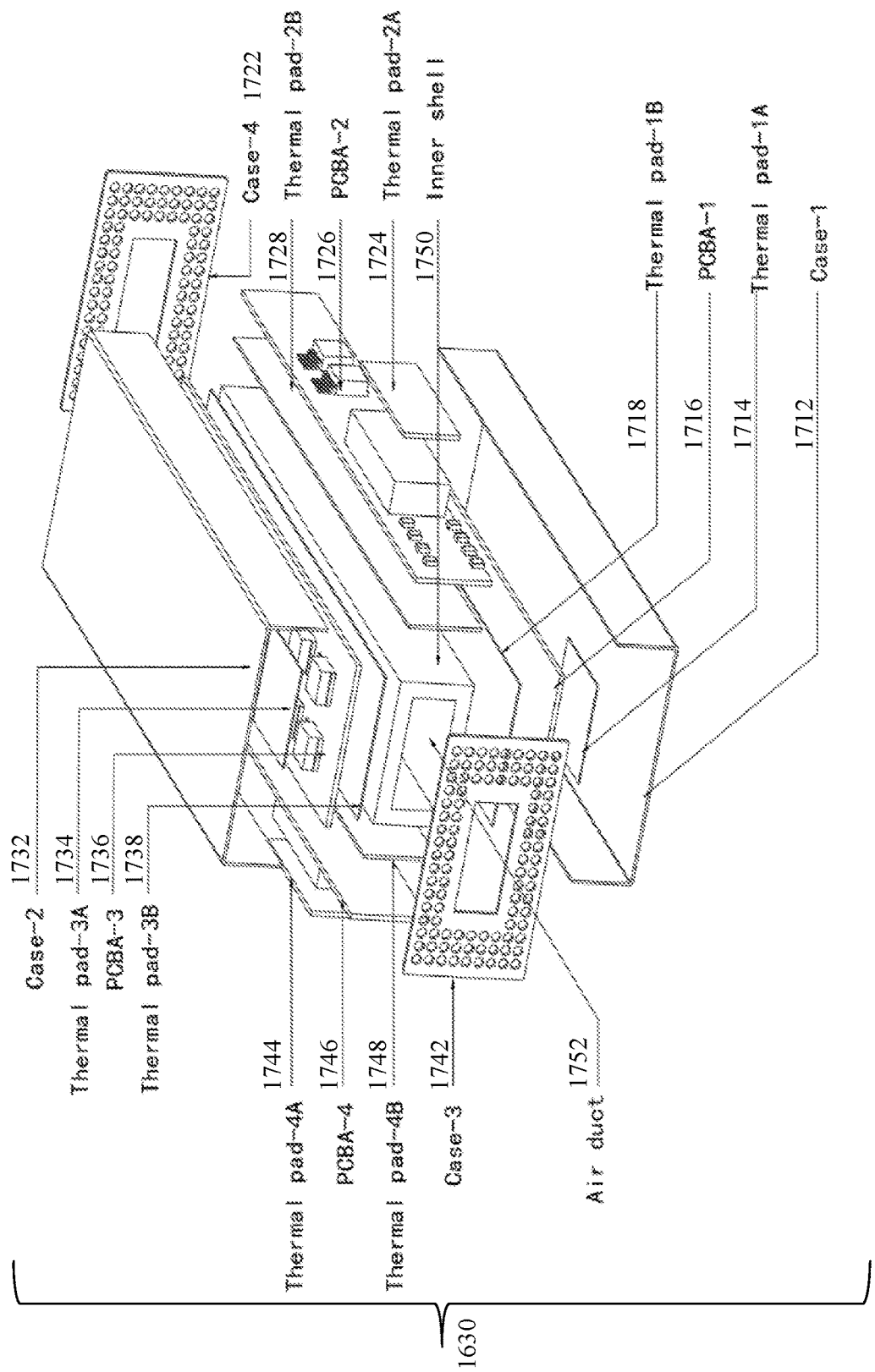
FIG. 17 illustrates an example exploded view of the windless power module cooling structure shown in FIG. 16 in accordance with various embodiments of the present disclosure.

FIG. 17 is a diagram illustrating an example exploded view 1700 of the windless power module cooling structure 1630 shown in FIG. 16 in accordance with various embodiments of the present disclosure. For description clarity purposes only, the same components in FIG. 16 are renumbered and/or renamed in FIG. 17. FIG. 17 illustrates an air duct 1752, which functions as a central ventilation channel for achieving the enhanced heat dissipation capability. As shown, the windless power module cooling structure 1630 includes a bottom case 1712 (case-1), a top case 1732 (case-2), a rear case 1722 (case-4) and a front case 1742 (case-3), which form the heat dissipation case 1632 in FIG. 16.

The windless power module cooling structure 1630 includes a thermal pad 1714 (thermal pad-1A), a PCBA 1716 (PCBA-1) and a thermal pad 1718 (thermal pad-1B) on the bottom portion of the windless power module cooling structure 1630; a thermal pad 1724 (thermal pad-2A), a PCBA 1726 (PCBA-2) and a thermal pad 1728 (thermal pad-2B) on the side portion (sidewall, e.g., right side) of the windless power module cooling structure 1630; a thermal pad 1734 (thermal pad-3A), a PCBA 1736 (PCBA-3) and a thermal pad 1738 (thermal pad-3B) on the top portion of the windless power module cooling structure 1630; and a thermal pad 1744 (thermal pad-4A), a PCBA 1746 (PCBA-4) and a thermal pad 1748 (thermal pad-4B) on the side portion (sidewall, e.g., left side) of the windless power module cooling structure 1630. The PCBAs 1716, 1726, 1736 and 1746 each may be mounted with one or more heat generating components/devices. As an example, the PCBA 1736 may have a configuration similar to the PCBA1-1 or PCBA1-2 as described with respect to FIGS. 2-3. The PCBA 1716 may have a configuration similar to the PCBA2-1 or PCBA2-2 in FIGS. 4-5.

In this example, each PCBA is mounted between two thermal pads. PCBA 1716 is mounted between the thermal pad 1714 and the thermal pad 1718. PCBA 1726 is mounted between the thermal pad 1724 and the thermal pad 1728. PCBA 1736 is mounted between the thermal pad 1734 and the thermal pad 1738. PCBA 1746 is mounted between the thermal pad 1744 and the thermal pad 1748. PCBA 1716 is mounted to the bottom case 1712 (case-1) via the thermal pad 1714. PCBA 1736 is mounted to the top case 1732 (case-2) via the thermal pad 1734. PCBA 1726 and PCBA 1746 are mounted respectively along the two sidewalls of the case.

The windless power module cooling structure 1630 further includes an inner shell 1750 (the inner shell 1634 in FIG. 16) having a ventilation hole, e.g., the air duct 1752 (corresponding to the air duct 1636 in FIG. 16). The air duct, and the inner shell, may be mounted along the direction of the system airflow. The inner shell 1750 forming the air duct 1752 may be mounted in the windless power module cooling structure 1630 in various ways. For example, the inner shell 1750 may be attached to one or more of the PCBAs, e.g., mounted to PCBA 1716, mounted to PCBAs 1726 and 1746, mounted to PCBAs 1716, 1726 and 1746, or mounted to all the four PCBAs. Other methods may also be applicable for mounting the inner shell in the windless power module cooling structure 1630, in order to provide the air duct for heat dissipation. The inner shell 1750 may be mounted to the PCBA(s) via thermal pad(s) attached to the PCBA(s). For example, the inner shell 1750 may be mounted to PCBAs 1716, 1726, 1736 and 1746 via the thermal pad 1718, 1728, 1738 and 1748, respectively.

While FIG. 17 shows that the windless power module cooling structure 1630 includes four PCBAs are shown, windless power module cooling structure 1630 may also include two PCBAs, and have a structure similar to that in FIG. 7, with an inner shell arranged inside. In this example, the inner shell may be mounted to the bottom PCBA, or to both the top PCBA and the bottom PCBA, as an example.

Figure 18:
FIG. 18 illustrates example locations of an air duct in an inner shell of a windless power module cooling structure in accordance with various embodiments of the present disclosure.

In the example of FIG. 17, the ventilation hole, i.e., the air duct 1752, is arranged in the center of the inner shell 1750. However, the ventilation hole (air duct) of the inner shell 1750 may not be limited to the central position, and it may be arranged in any position of the inner shell. FIG. 18 is a schematic diagram showing a front view of the inner shell 1750, highlighting example possible positions that the air duct may be arranged in the inner shell. The front view of the inner shell in this example shows the cross section of the inner shell in a shape of rectangle for description simplicity. As shown, the air duct may be arranged at the top of the inner shell (i.e., the upper air duct 1812), at the bottom of the inner shell (i.e., the down air duct 1814), at the left side of the inner shell (i.e., the left air duct 1816), or at the right side of the inner shell (i.e., the right air duct 1818).

The terms "top", "bottom", "right side", "left side", "front" and "rear" as used herein are merely for illustration purposes to indicate relative positions or directions of components in embodiments of the present disclosure, and are not intended to be limiting to the scope of the present disclosure. The relative positions or directions of the components may be indicated or illustrated differently, which still falls within the scope of the present disclosure.

Figure 19:
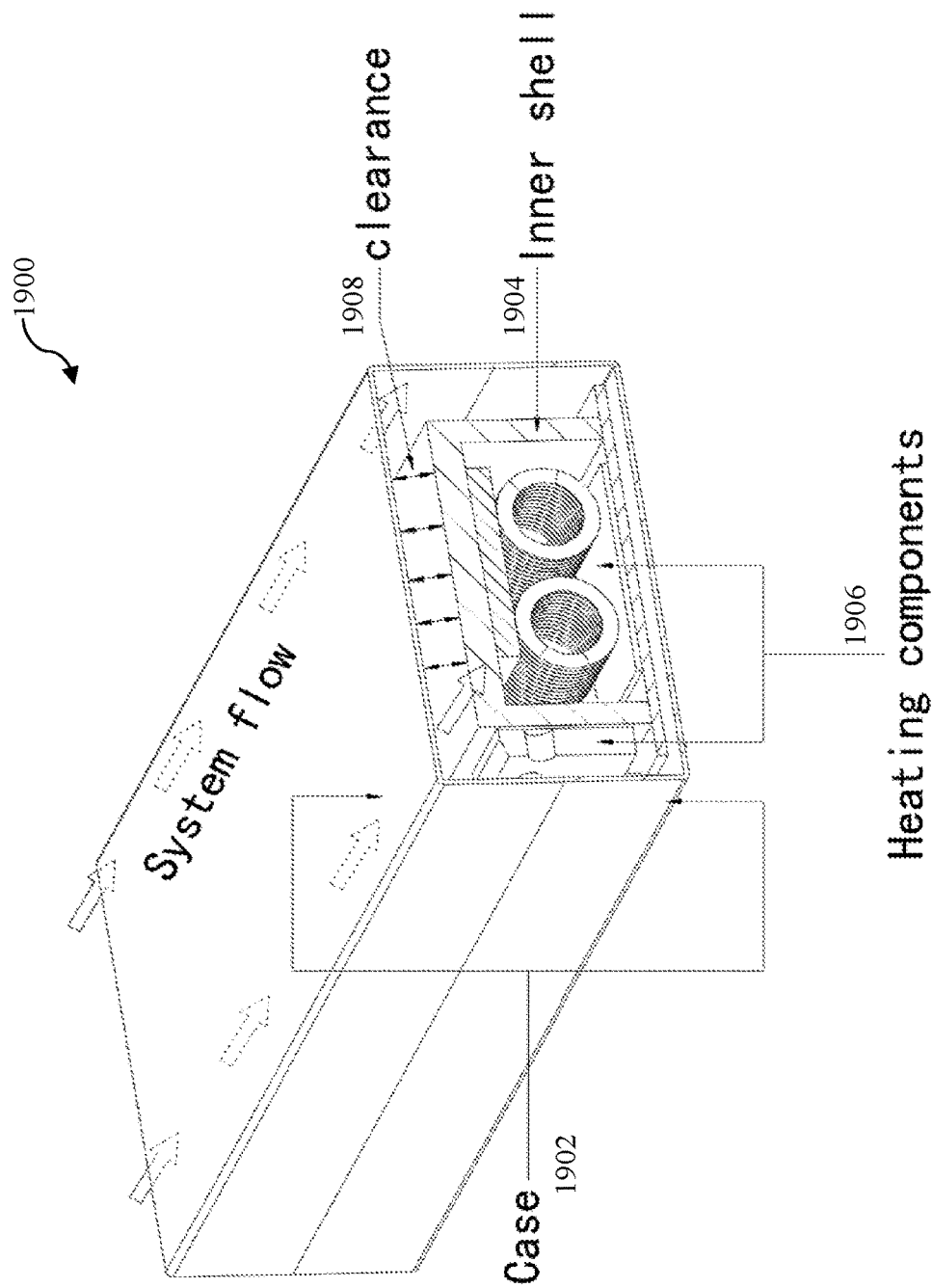
FIG. 19 illustrates another example windless power module cooling structure in accordance with various embodiments of the present disclosure.

In some embodiments, the internal heat dissipation case, e.g., the inner shell 1750, may be assembled directly onto a PCB (e.g., PCBA 1716) as part of the PCBA, the heat generating components may be mounted to the internal heat dissipation case, and the gap between the internal heat dissipation case and the external heat dissipation case may function as an air duct. The heat from the heat generating components is transferred to the internal heat dissipation case and then carried away by the system air flowing in the gap. FIG. 19 shows an example of such implementation of the air duct in accordance with various embodiments of the present disclosure. FIG. 19 is a diagram showing an example windless power module cooling structure 1900, which includes a case 1902, and an inner shell 1904 arranged in the case 1902. Heat generating components 1906 (also referred to as heat components in the figures), which generate heat in operation, may be housed by and/or the mounted to the inner shell 1904. The heat generating components 1906 may include power supply devices. The inner shell 1904 is arranged such that there is clearance 1908 (or gap) between the case 1902 and the inner shell 1904. The inner shell 1904 may be mounted to a PCBA (not shown) as a part of the PCBA of the windless power module cooling structure 1900. The heat from the heat components 1906 mounted on the inner shell 1904 is transferred to the inner shell 1904 and carried away by the system air in the gap (e.g., in the direction as shown by the arrows).

Figure 20:
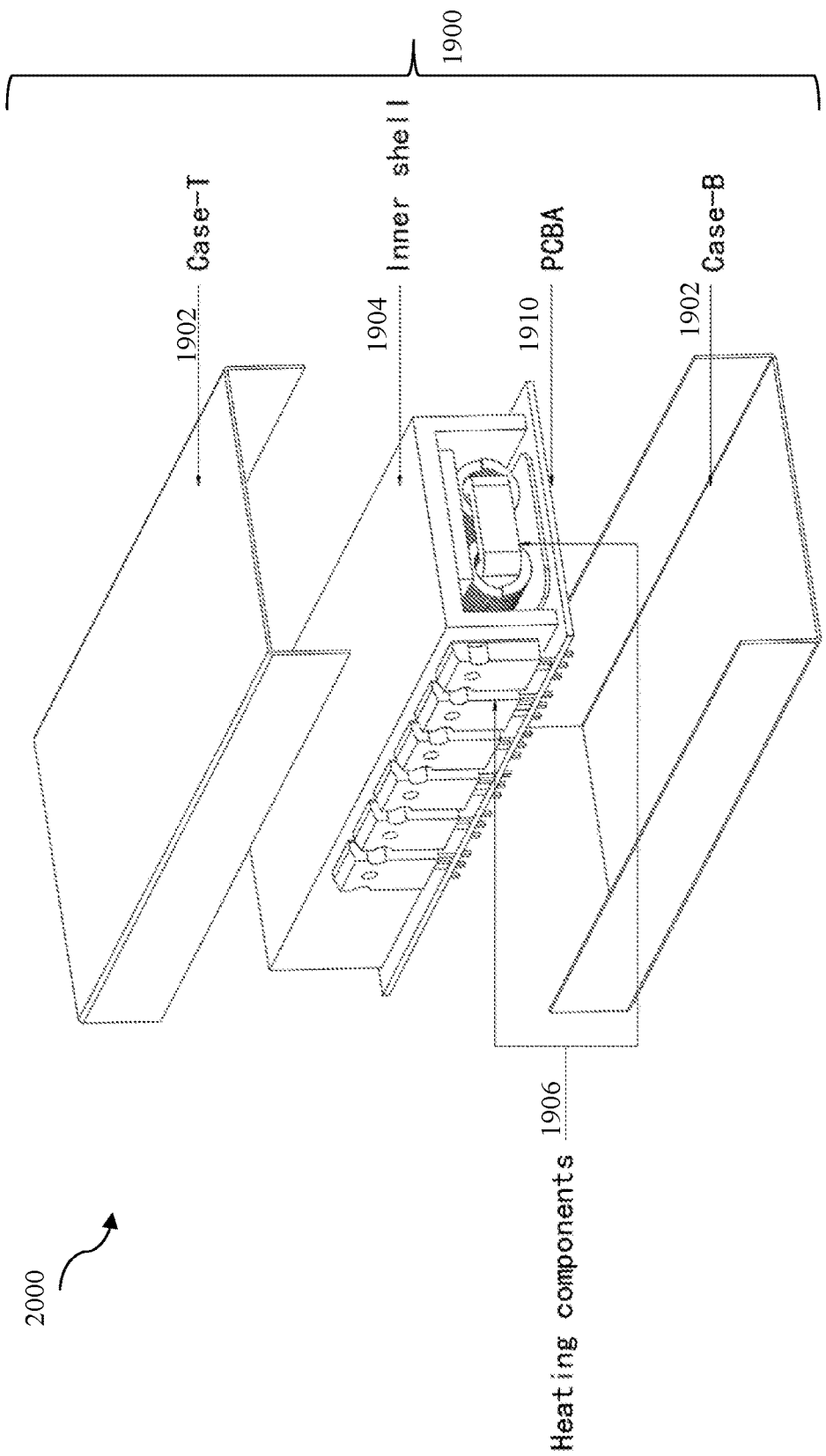
FIG. 20 illustrates an example exploded view of the windless power module cooling structure shown in FIG. 19 in accordance with various embodiments of the present disclosure.

FIG. 20 is a diagram illustrating an example exploded view 2000 of the windless power module cooling structure 1900 shown in FIG. 19 in accordance with various embodiments of the present disclosure. The reference numbers of the components in FIG. 19 are reused in FIG. 20 for description simplicity. As shown, the windless power module cooling structure 1900 includes the case 1902, the inner shell 1904, the heating components 1906 mounted to the inner shell 1904 (internal heat dissipation case), and a PCBA 1910. In an embodiment, one or more heating components 1906 may be mounted on an exterior surface of the inner shell 1904, and/or one or more heating components 1906 may be mounted on an internal surface of the inner shell 1904, i.e., inside the air duct of the inner shell 1904. The case 1902 may include a top portion (case-T) and a bottom portion (case-B). The inner shell 1904 is mounted on the PCBA 1910. The PCBA 1910 is attached to the bottom portion of the case 1902 (i.e., case-B). A gap is arranged between the case-T 1902 and a top surface of the inner shell 1904.

In an example, the air duct of the inner shell 1904 or gaps within the air duct of the inner shell 1904 when heating components 1906 are mounted inside the inner shell 1904 (i.e., in the air duct), and the gap between the inner shell and the case-T, may form airflow passages of the windless power module cooling structure 1900.

In some embodiments, the windless power module cooling structure 1900 may also include a top PCB (not shown) mounted to the case-T 1902. The inner shell 1904 may be mounted on the PCBA 1910 such that a gap is formed between the inner shell 1904 and the top PCB, allow system airflow to pass.

As discussed above, the primary heat dissipation path of a windless power supply is from the heat-generating devices to the heat dissipation case(s), and the large external surface area of the heat dissipation case(s) is utilized to exchange heat with the surrounding air. In some applications, an apparatus or a system, e.g., a power supply system, itself may include a large heat dissipation shell (referred to as system shell in the following), which may have a large heat sink surface or utilize some enhanced heat dissipation methods such as forced air-cooling, water-cooling and the like. It is desirable that, in such a system, heat may be transferred quickly from the case of a power supply device (e.g., the case 612 in FIG. 6, the cases 912, 928, 942, 962 in FIG. 9, the case 1212 in FIG. 12, etc.) to the system shell housing the power supply device. The case/shell of the power supply device may be referred to as a power case, power supply case, power supply shell or power shell in the following. Specifically, the terms of "power case" and "power shell" may be used interchangeably.

Embodiments of the present disclosure provide an efficient heat dissipation solution for such a power supply system. In some embodiments, the power supply shell may directly or indirectly be arranged to be in touch with the system shell with good contact. For example, methods such as screw fixing, thermal conductive adhesive gluing, snap fixing, press block fixing, and so on, may be utilized for the power supply shell to effectively touch the system shell, such that heat may be quickly transferred to the system shell and spread to the surrounding environment. In this way, the system shell is utilized to quickly dissipate heat.

Figure 21:
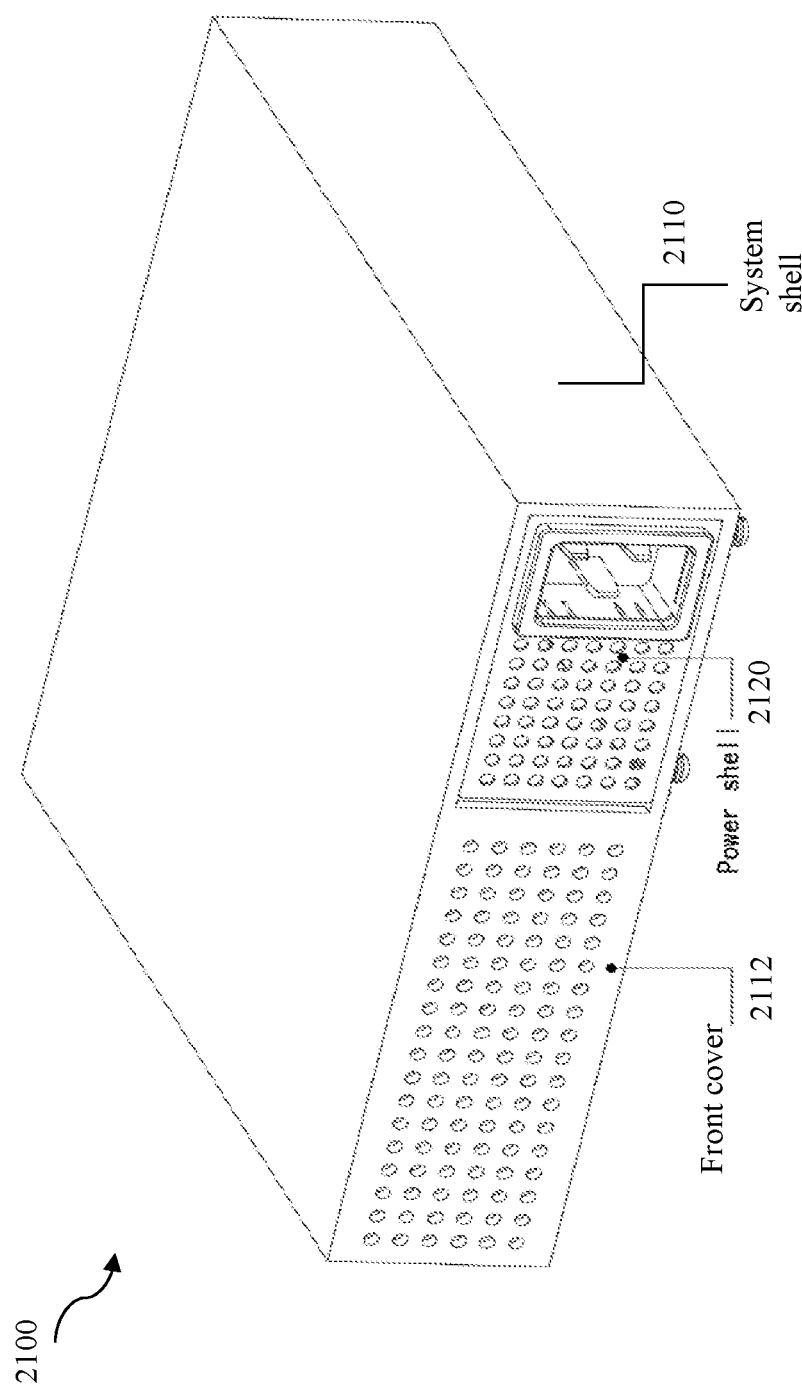
FIG. 21 illustrates another example power supply system in accordance with various embodiments of the present disclosure.
Figure 22:
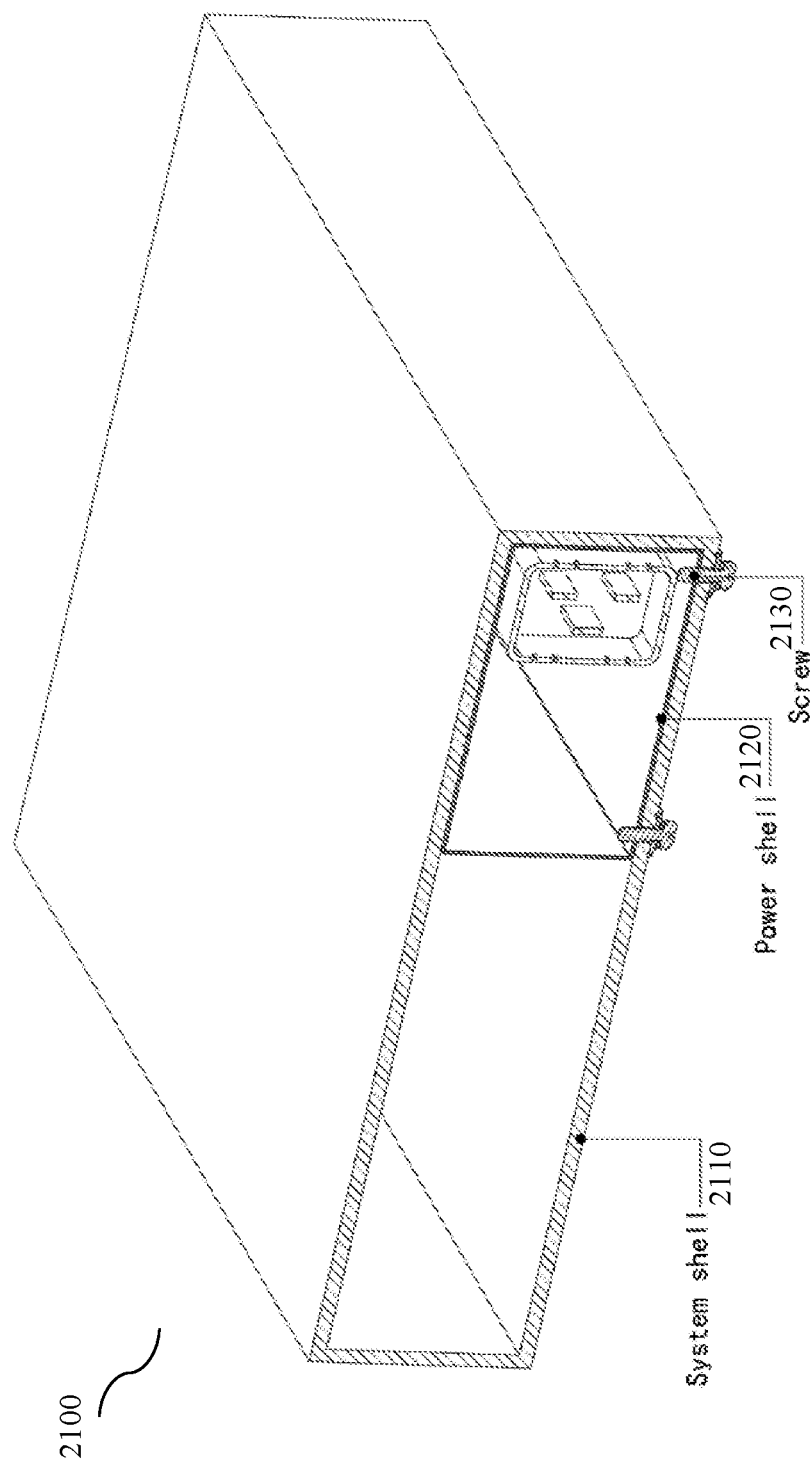
FIG. 22 illustrates an example perspective view of the power supply system shown in FIG. 21 in accordance with various embodiments of the present disclosure.
Figure 23:
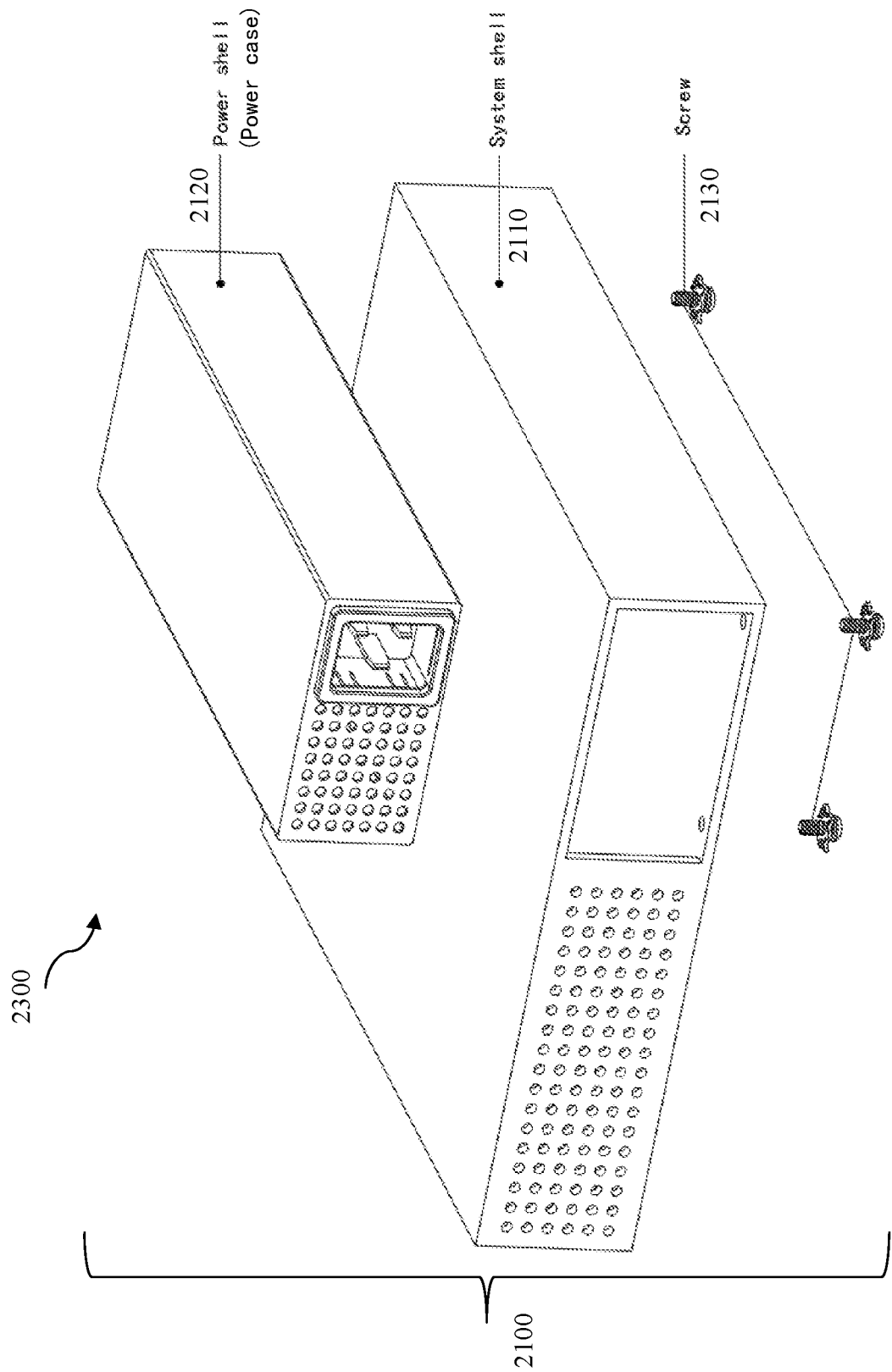
FIG. 23 illustrates an example exploded view of the power supply system shown in FIG. 21 in accordance with various embodiments of the present disclosure.

FIG. 21 is a diagram of an example power supply system 2100 in a perspective view in accordance with various embodiments of the present disclosure, highlighting system and power shells. The power supply system 2100 includes a system shell 2110 enclosing a power shell 2120, and a front cover 2112. The front cover 2112 may be a part of the system shell 2110. The power shell 2120 may enclose or house power supply components. As an example, the power shell 2120 may include a windless power module cooling structure as described above, e.g., windless power module cooling structure described with respect to FIG. 7, FIG. 9, and FIG. 17. FIG. 22 is a diagram showing an example perspective view of the power supply system 2100 after the front cover 2112 has been removed in accordance with various embodiments of the present disclosure. In the example as shown, the power shell 2120 may be mounted to the system shell 2110 using screw(s) 2130. Other mounting methods allowing the power shell 2120 to have a good contact with the system shell 2110 may also be applicable. FIG. 23 is a diagram showing an example exploded view 2300 of the power supply system 2100 shown in FIG. 21 in accordance with various embodiments of the present disclosure. The components in FIG. 23 have been described above and will not be repeated here.

In some embodiments, the outer surface of the power supply shell may include a thermally conductive reinforcing component, arranged on a portion of the outer surface or an entire outer surface of the power supply shell. As examples, the thermally conductive reinforcing component may include heat pipe(s), temperature equalization plate(s), graphene thermal conductive film(s), and/or material(s) with better thermal conductivity than the power shell (or case) itself. For example, the power supply may have an aluminum case (shell) with a copper sheet overlay.

In some embodiments, the outer surface of the power supply shell may have a toothed structure. The corresponding outer surface of the system shell in contact with the power supply shell may have a matching toothed structure. This configuration increases the contact area between the power supply shell and the system shell, enabling heat to be transferred more quickly to the system shell and dissipated.

In some embodiments, a graphene based thermal conductive film may be affixed between the power supply shell and the toothed structure of the system shell, which enhances the thermal conductivity and enables heat to be transferred to the system shell more quickly.

In some embodiments, a thermally conductive interface material (TIM), e.g., liquid metal, thermally conductive gasket, thermally conductive foam, and so on, may be filled in gaps between the power supply shell and the system shell, e.g., gaps that may exist where the power supply shell and the system shell are attached, which allows heat to be transferred more quickly to the system shell.

Figure 24:
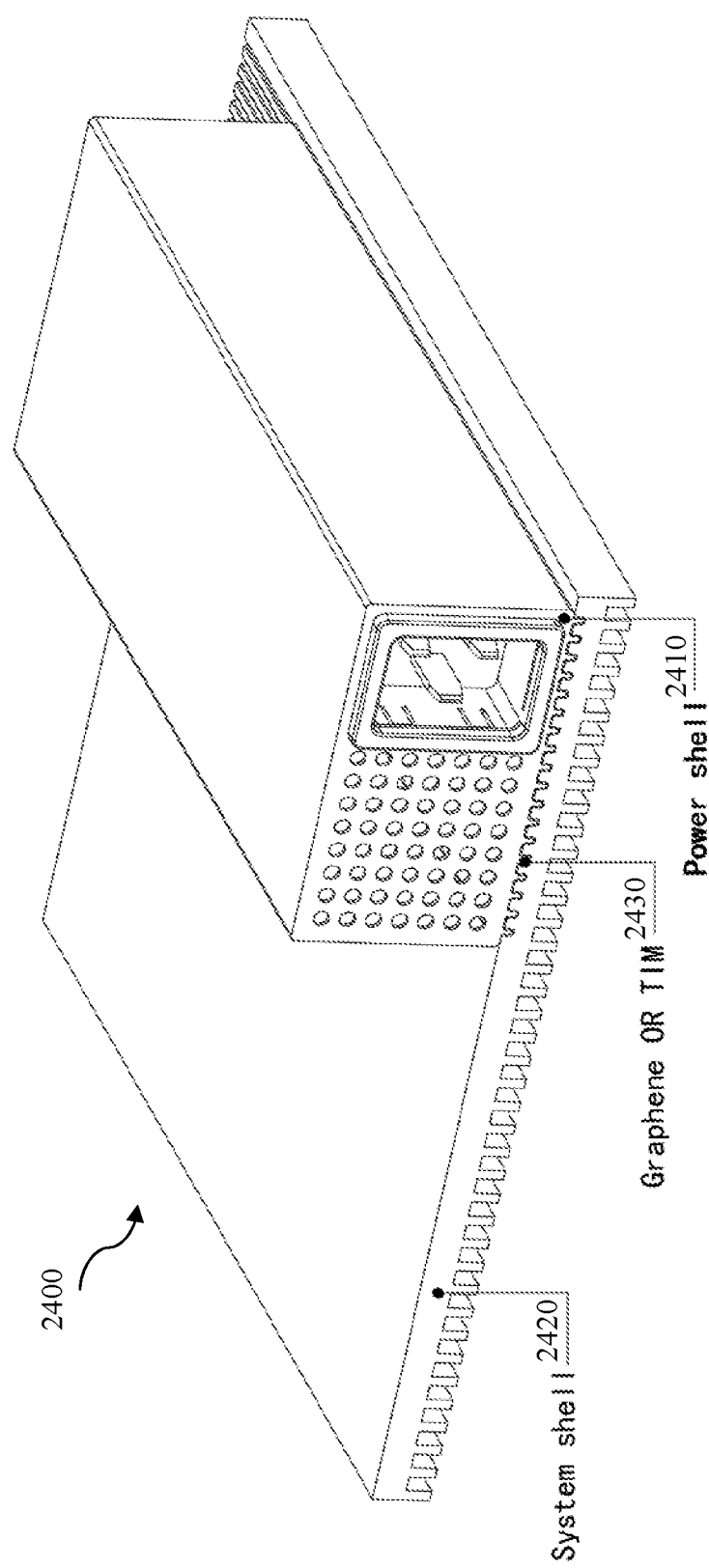
FIG. 24 illustrates another example power supply system in accordance with various embodiments of the present disclosure.

FIG. 24 is a diagram of an example power supply system 2400 in accordance with various embodiments of the present disclosure, highlighting a power shell 2410 assembled in contact with a system shell 2420. A graphene based thermal conductive material or thermal interface material (TIM) layer 2430 (referred to as graphene or TIM in FIG. 24) may be provided between the system shell 2420 and the power shell 2410. In an example, the layer 2430 may use a graphene based TIM. FIG. 24 also shows the toothed structure arranged between the power shell 2410 and the system shell 2420. The layer 2430 may be configured with a matching toothed structure.

Figure 25:
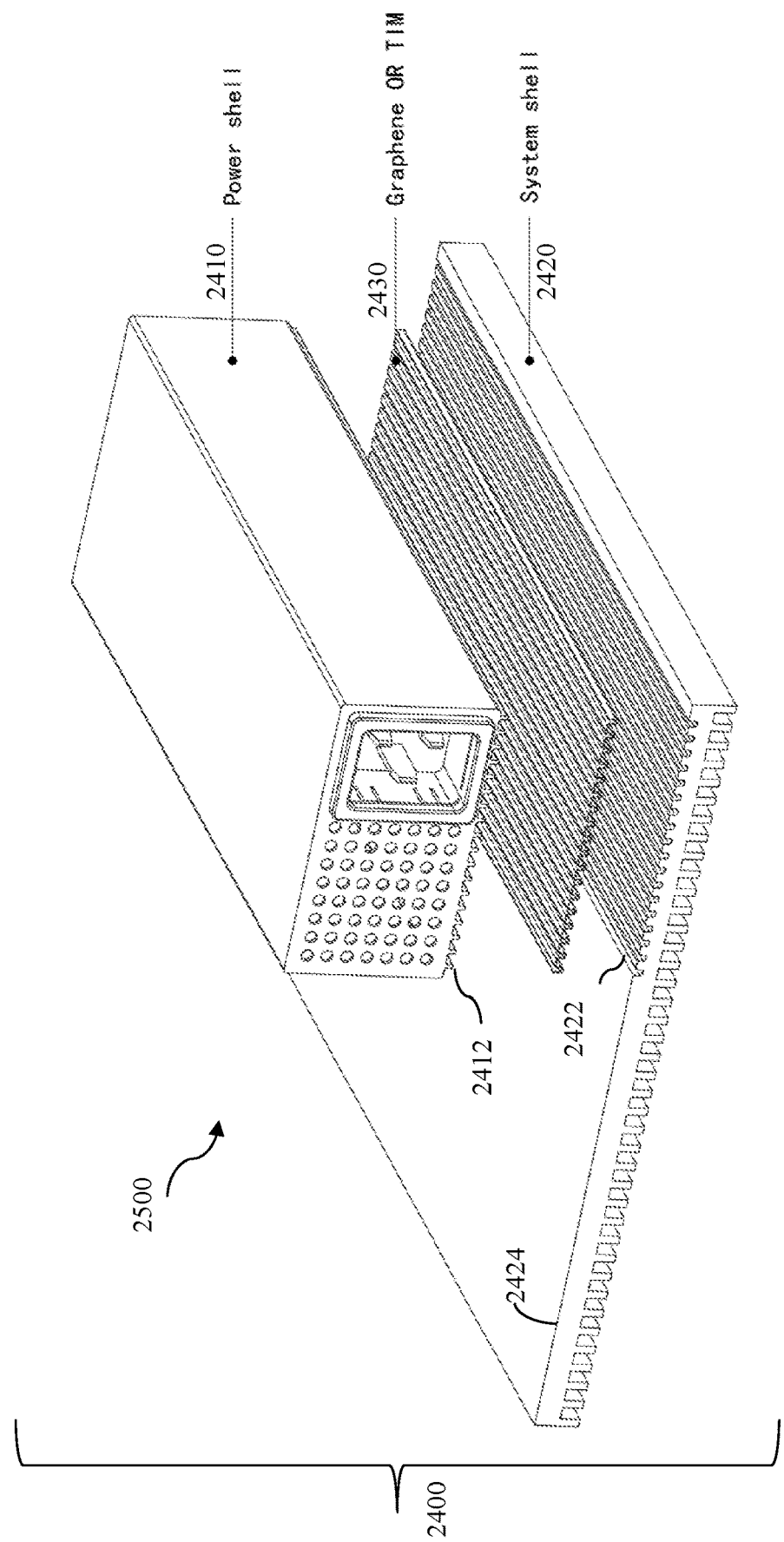
FIG. 25 illustrates an example exploded view of the power supply system shown in FIG. 24 in accordance with various embodiments of the present disclosure.

FIG. 25 is a diagram showing an example exploded view 2500 of the power supply system 2400 in FIG. 24 in accordance with various embodiments of the present disclosure. The power supply system 2400 includes the power shell 2410, the system shell 2420 and the graphene or TIM layer 2430. FIG. 25 also shows, as an example, a toothed structure 2412 on a bottom outer surface of the power shell 2410, and a toothed structure 2422 on a portion of a bottom inner surface 2424 of the system shell 2420. The toothed structure 2422 matches the toothed structure 2412. The graphene or TIM layer 2430 is also in a toothed structure matching the toothed structure 2412, such that the power shell 2410 and the system shell 2420 are attached at the graphene or TIM layer 2430.

Figure 26:
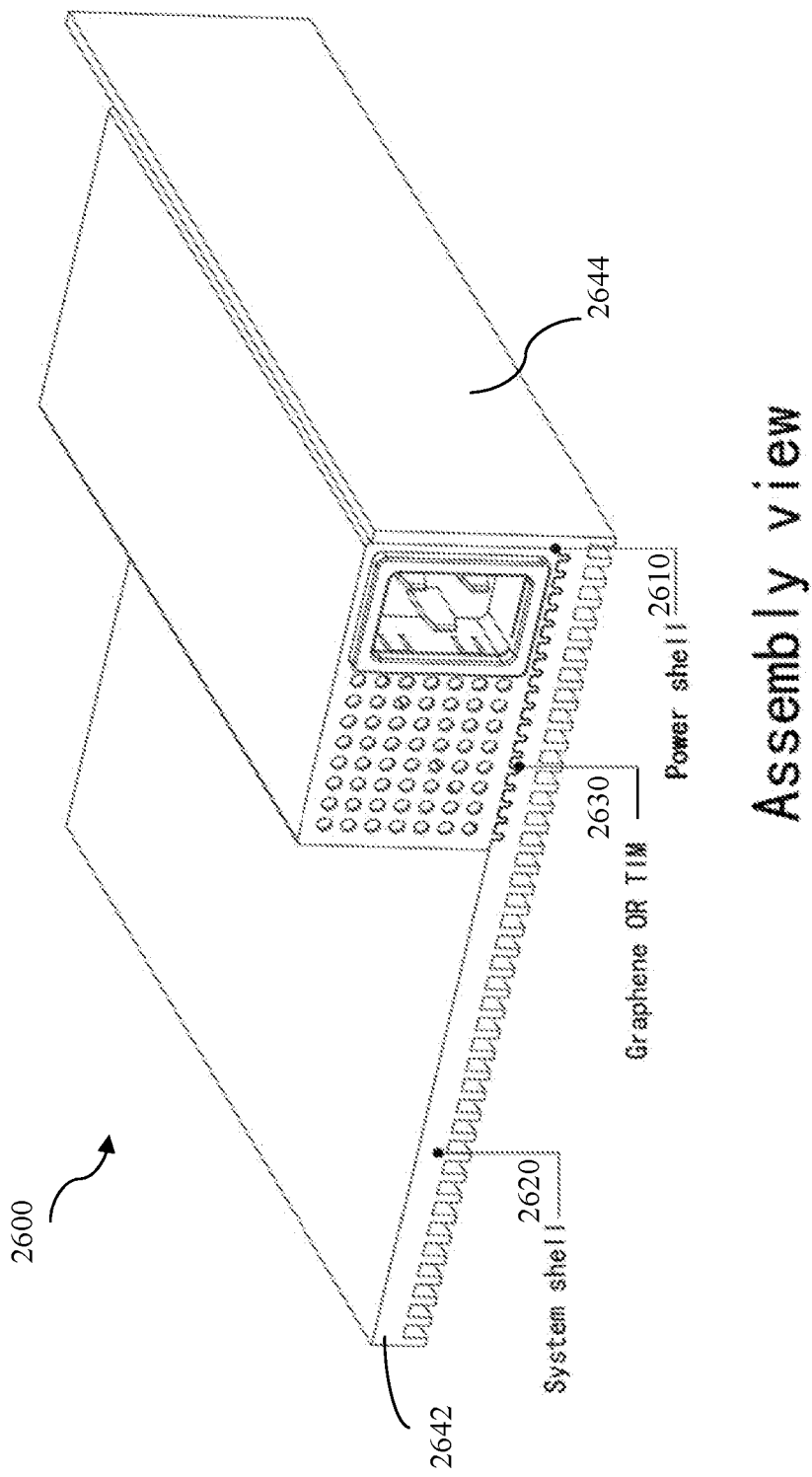
FIG. 26 illustrates another example power supply system in accordance with various embodiments of the present disclosure.

FIG. 26 is a diagram showing another example power supply system 2600 in accordance with various embodiments of the present disclosure, highlighting a power shell 2610 assembled in contact with a system shell 2620. A graphene based thermal interface material (TIM) layer 2630 (referred to as graphene or TIM) is placed between the system shell 2620 and the power shell 2610. In this example, the system shell 2620 includes a horizontal portion 2642 and a vertical portion 2644. A bottom surface of the power shell 2610 is in contact with the horizontal portion 2642. A sidewall (not shown) of the power shell 2610 is in contact with the vertical portion 2644.

Figure 27:
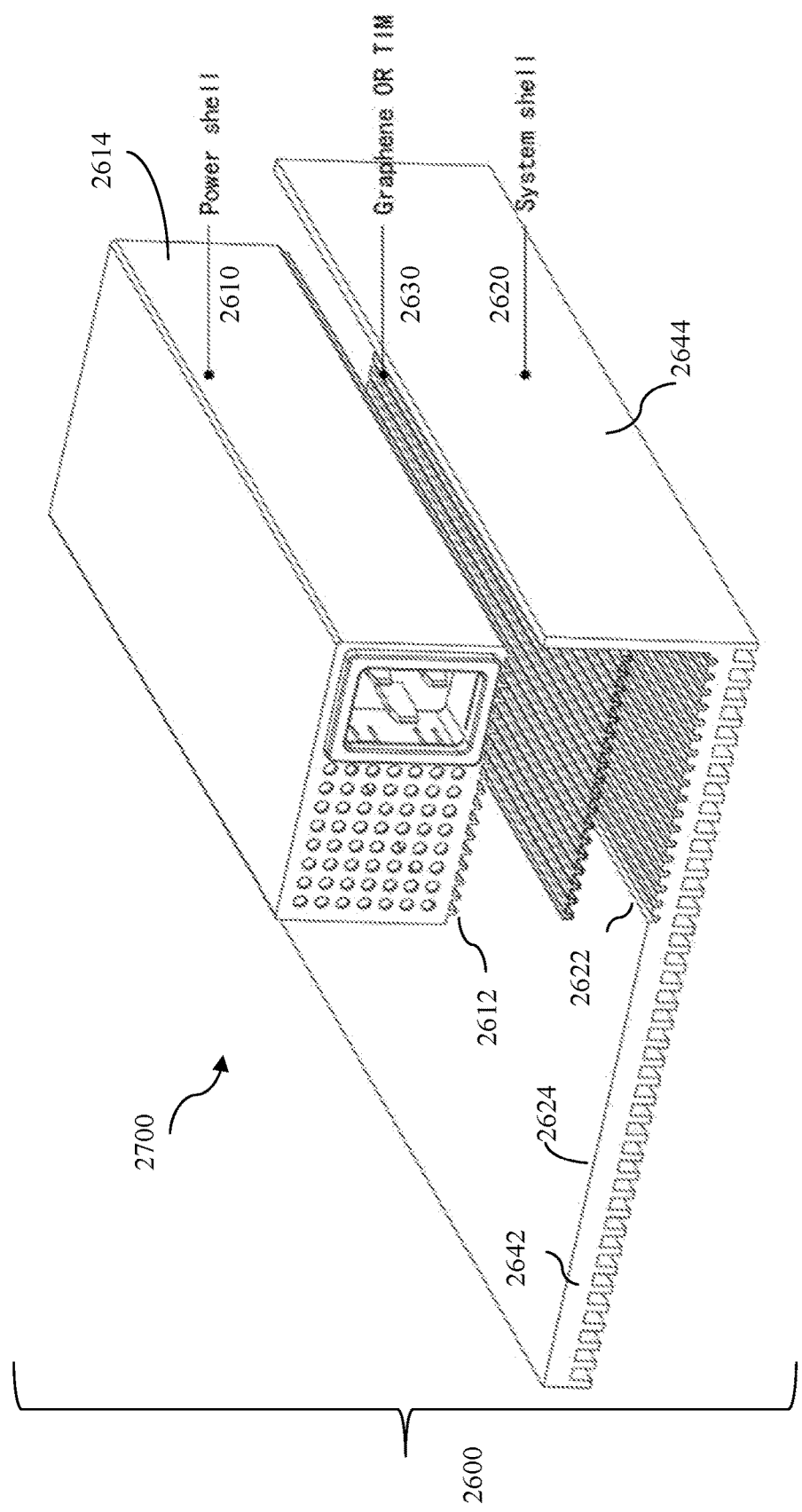
FIG. 27 illustrates an example exploded view of the power supply system shown in FIG. 26 in accordance with various embodiments of the present disclosure.

FIG. 27 is a diagram showing an example exploded view 2700 of the power supply system 2600 shown in FIG. 26 in accordance with various embodiments of the present disclosure. As shown, the power supply system 2600 may include the power shell 2610, the system shell 2620 and the graphene or TIM layer 2630. FIG. 27 also shows, as an example, a toothed structure 2612 on a bottom outer surface of the power shell 2610, and a toothed structure 2622 on a portion of the upper surface 2624 of the horizontal portion 2642 of the system shell 2620. The toothed structure 2622 matches the toothed structure 2612. The graphene or TIM layer 2630 is also in a toothed structure matching the toothed structure 2612, such that the power shell 2610 and the system shell 2620 are attached at the graphene or TIM layer 2630. A sidewall 2614 of the power shell 2610 may be assembled/mounted to be in contact with the vertical portion 2644 of the system shell 2620.

Figure 28:
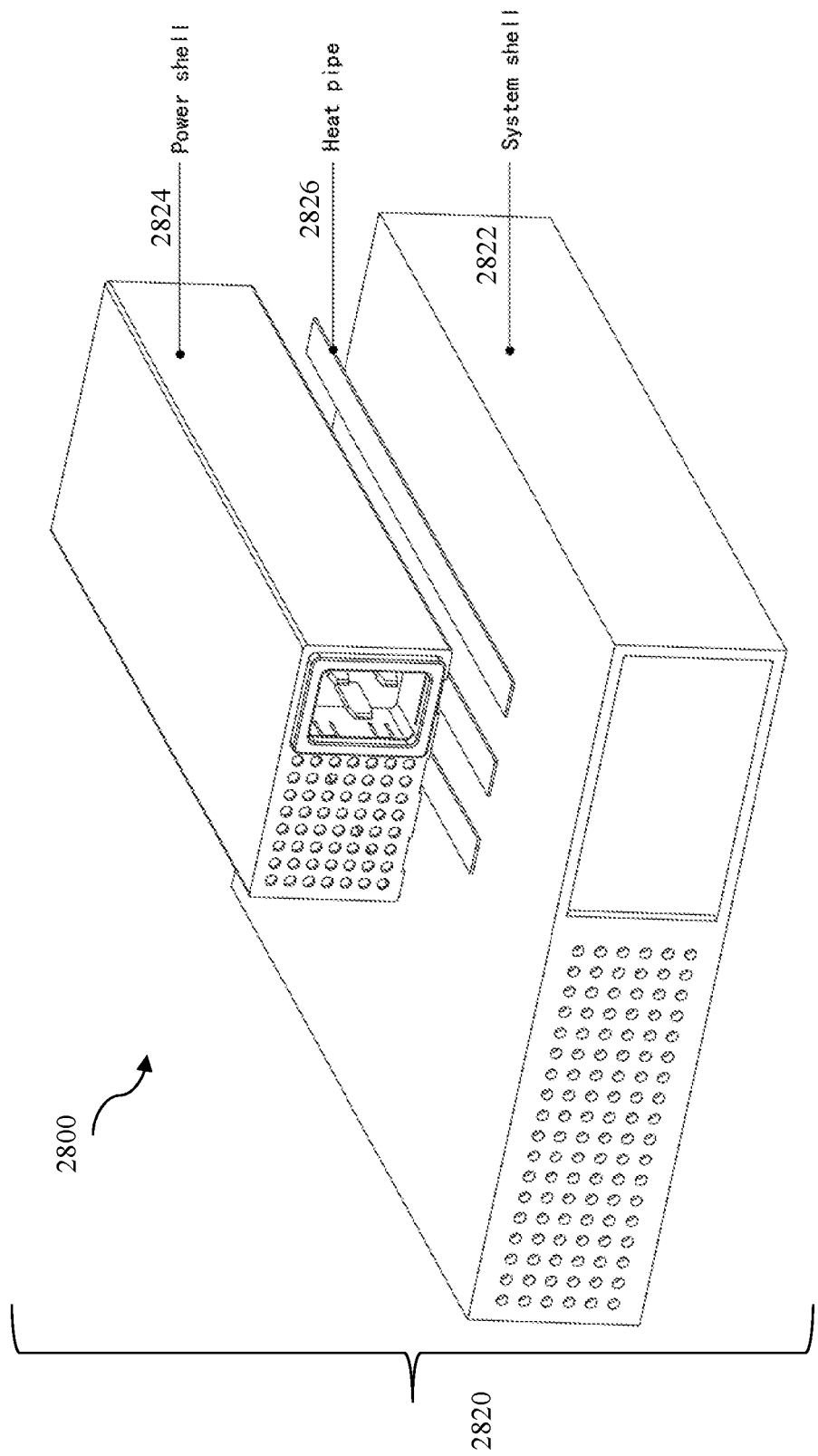
FIG. 28 illustrates another example power supply system having heat pipes in exploded view in accordance with various embodiments of the present disclosure.
Figure 29:
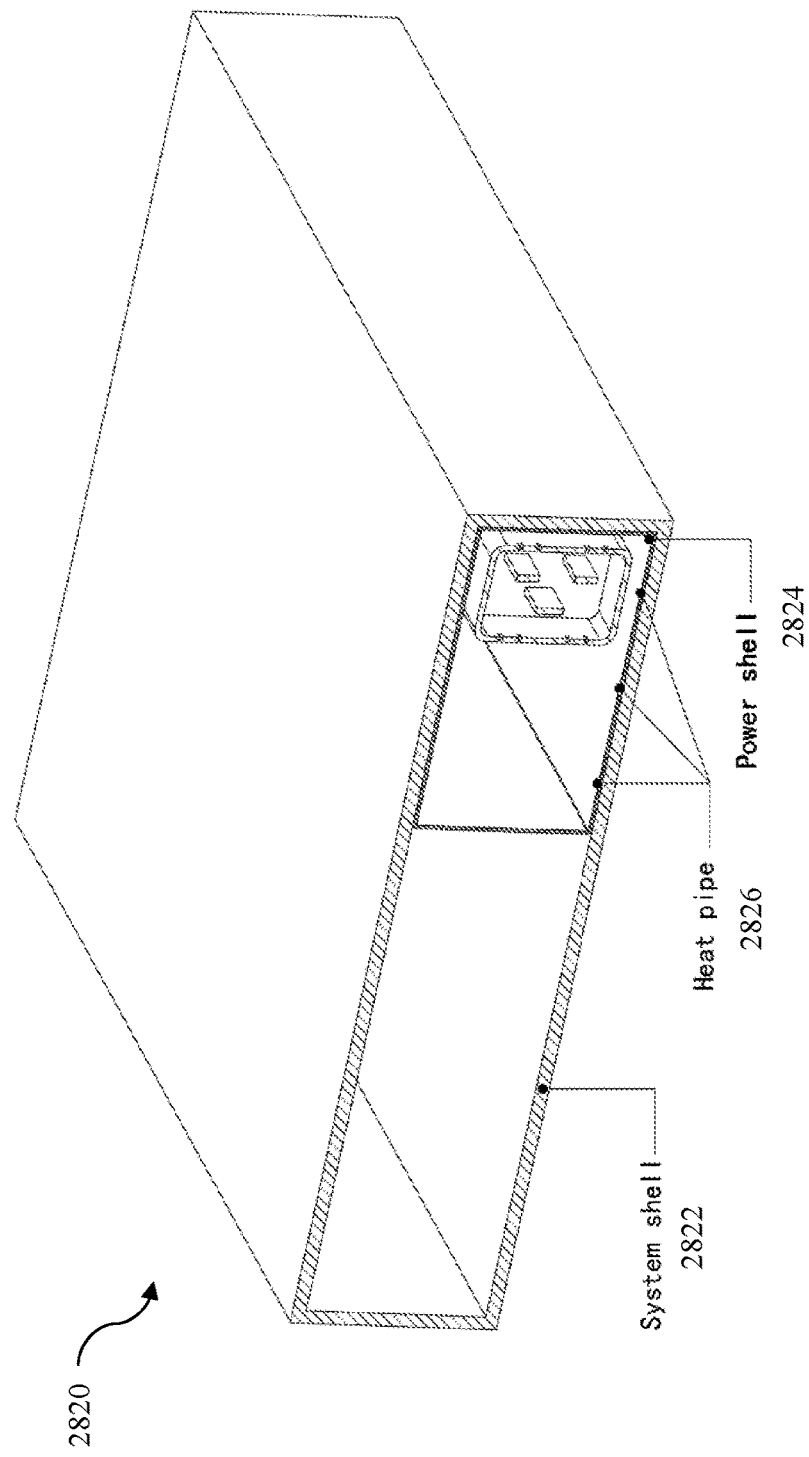
FIG. 29 illustrates a perspective view of the power supply system in FIG. 28 in accordance with various embodiments of the present disclosure.

FIG. 28 is a diagram of an exploded view 2800 of an example power supply system 2820 having heat pipes in accordance with various embodiments of the present disclosure. As shown in FIG. 28, the power supply system 2820 includes a system shell 2822, a power shell 2824 that may be housed in the system shell 2822, and a plurality of heat pipes 2826 that may be placed between the system shell 2822 and the power shell 2824. As an example, the plurality of heat pipes 2826 may be placed between a bottom outer surface of the power shell 2824 and a portion of a bottom inner surface of the system shell 2822, as shown in FIG. 29 in the following. The plurality of heat pipes 2826 may be placed in a direction along one side of the power shell 2824, e.g., along the length of the power shell 2824, and have a length the same as or less than the length of the power shell 2824. The plurality of heat pipes 2826 may be spaced apart evenly between the system shell 2822 and the power shell 2824. The plurality of heat pipes 2826 may use aluminum, copper or other materials having good thermal conductivity.

FIG. 29 is a diagram illustrating an example perspective view 2900 of the power supply system 2820 in accordance with various embodiments of the present disclosure, highlighting the assembled heat pipes 2826. The heat pipes 2826 are placed between the power shell 2824 and the system shell 2822. The heat pipes may be employed to improve heat-transferring efficiency.

Figure 30:
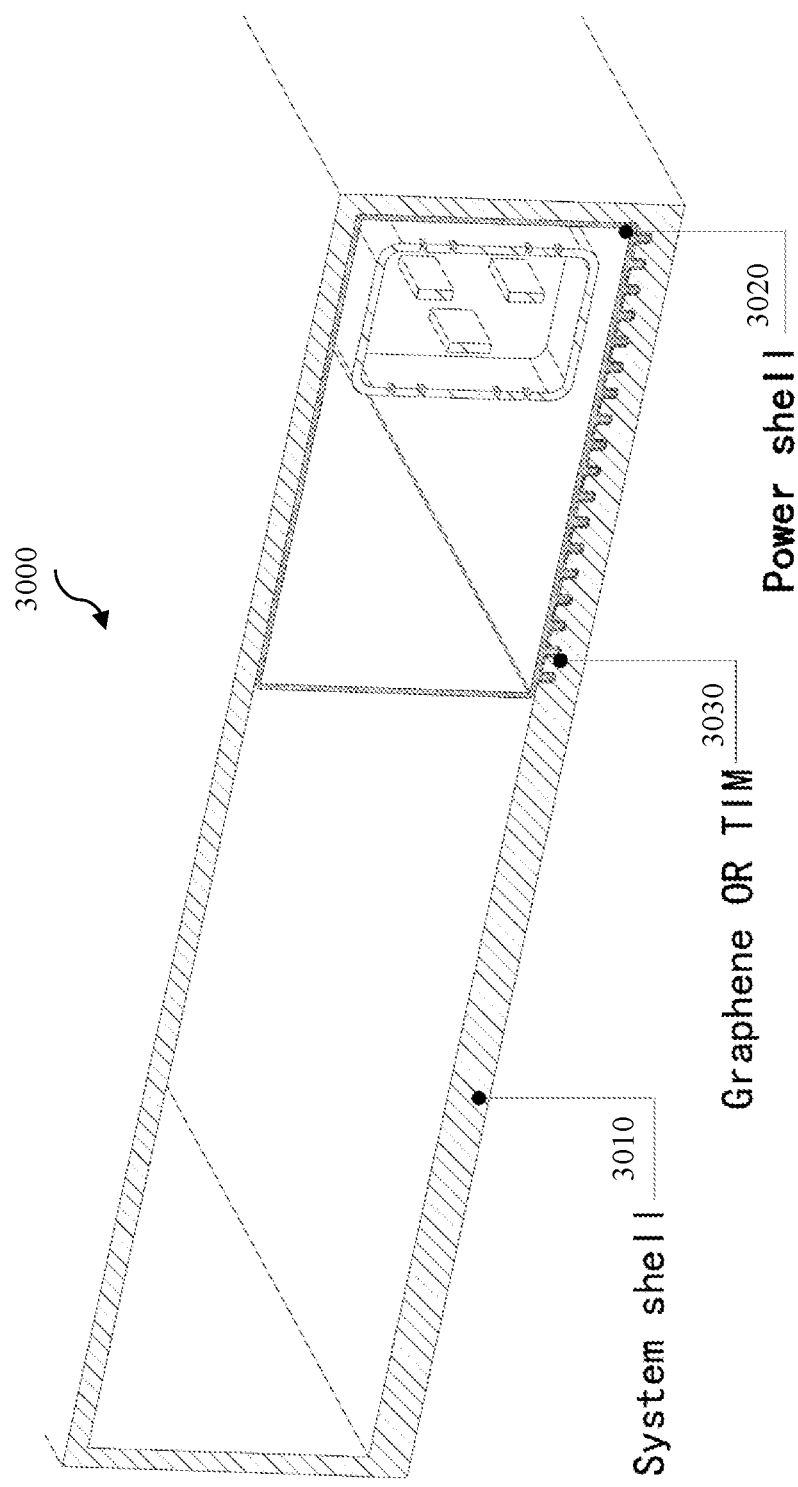
FIG. 30 illustrates a perspective view of a portion of another example power supply system having a graphene thermally conductive film layer in accordance with various embodiments of the present disclosure.

In some embodiments, a toothed structure and/or a graphene thermally conductive film or TIM layer may be added to the above embodiments in order to improve heat-transferring efficiency. A thermally conductive cross-sectional material may also be filled in gaps. FIG. 30 is a diagram illustrating a perspective view 3000 of a portion of a power supply system in accordance with various embodiments of the present disclosure, highlighting a graphene thermally conductive film layer and a toothed structure. As shown, the power supply system includes a system shell 3010, a power shell 3020, and a graphene or TIM layer 3030 between the system shell 3010 and the power shell 3020. A surface of the system shell 3010 and a portion of a surface of the power shell 3020 that are in contact with each other may have matching toothed structures to increase the contact area so as to increase the heat dissipation efficiency.

Figure 31:
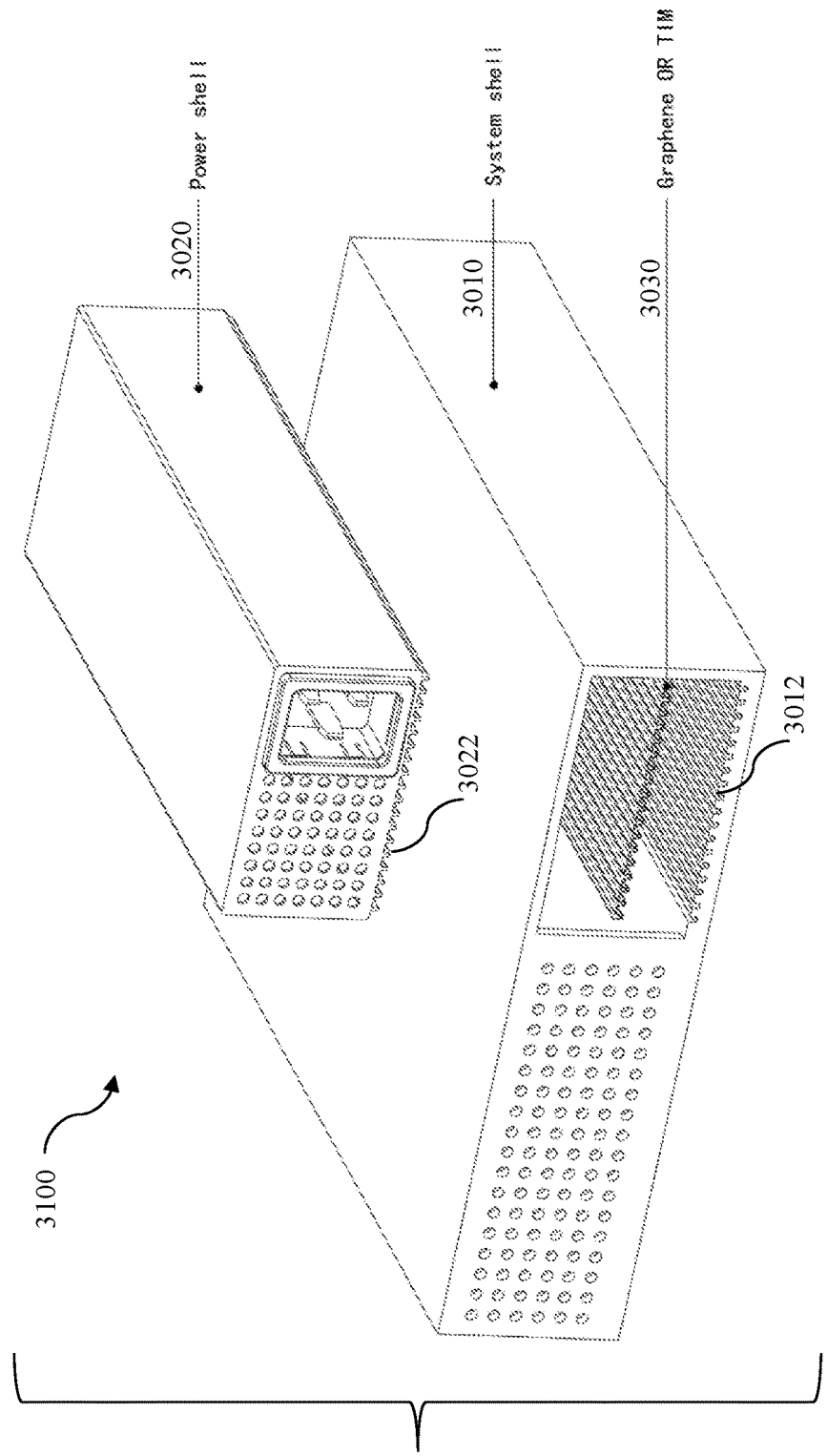
FIG. 31 illustrates an example exploded view of the power supply system shown in FIG. 30 in accordance with various embodiments of the present disclosure.

FIG. 31 is a diagram illustrating an example exploded view 3100 of the power supply system shown in FIG. 30 in accordance with various embodiments of the present disclosure. As shown, a bottom surface 3022 of the power shell 3020 may have a toothed structure, and a portion 3012 of the bottom surface of the system shell 3010 may have a matching toothed structure. The graphene or TIM layer 3030 may also be in the toothed structure to be placed between the power shell 3020 and the system shell 3010.

In accordance with an embodiment, an apparatus comprises a first thermal pad over a top case of a heat dissipation structure, a first PCB having a first side and a second side, wherein a second side of the first PCB is coupled to the first thermal pad, and a plurality first heat-generating devices placed on the first side of the first PCB, a second thermal pad over a bottom case of the heat dissipation structure, and a second PCB having a first side and a second side, wherein a second side of the second PCB is coupled to the second thermal pad, and a plurality second heat-generating devices placed on the first side of the second PCB.

The above solutions are not limited to one form of application and various forms can be combined to achieve better heat dissipation. The embodiment windless power module cooling structures and techniques for heat dissipation above are not only applicable to power supply systems/ devices, but also various other electronic systems and devices having heat generating components. One or more features of the above described embodiments of the present disclosure may be combined, and one or more embodiments of the present disclosure may be combined, without departing from the spirit and scope of the disclosure. An embodiment including one or more features of any one of more of the above described embodiments of the present disclosure belongs to the scope of the present disclosure.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and/or steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An apparatus comprising:
   a first case comprising a top portion and a bottom portion opposite to each other;
   a first circuit board within the first case, the first circuit board having a first surface and a second surface opposite to each other, and the first circuit board attached to the top portion of the first case via the second surface of the first circuit board, with at least one first heat-generating device mounted on the first surface of the first circuit board;
   a first thermal pad disposed between the first circuit board and the top portion of the first case; and
   a second circuit board within the first case, the second circuit board having a first surface and a second surface opposite to each other, and the second circuit board attached to the bottom portion of the first case via the second surface of the second circuit board, with at least one second heat-generating device mounted on the first surface of the second circuit board; and
   a first thermally conductive potting adhesive layer disposed between the first thermal pad and the first circuit board.

2. The apparatus of claim 1, wherein the first circuit board and second circuit board are printed circuit boards (PCBs), and the apparatus further comprises:
   a second thermal pad disposed between the second circuit board and the bottom portion of the first case; and
   a second thermally conductive potting adhesive layer disposed between the second thermal pad and the second circuit board.

3. The apparatus of claim 1, further comprising:
   a cable configured to electrically connect the first circuit board and the second circuit board.

4. The apparatus of claim 1, further comprising:
   a third circuit board connected between the first circuit board and the second circuit board along a first sidewall of the first case; and
   a fourth circuit board connected between the first circuit board and the second circuit board along a second sidewall of the first case, the third circuit board and the fourth circuit board being opposite to each other.

5. The apparatus of claim 4, further comprising:
a first cable configured to electrically connect the first circuit board and the second circuit board;
a second cable configured to electrically connect the third circuit board and the second circuit board; and
a third cable configured to electrically connect the fourth circuit board and the second circuit board.

6. The apparatus of claim 1, wherein:
the first circuit board has a substrate of a first type of metal; and
the second circuit board has a substrate of a second type of metal.

7. The apparatus of claim 1, wherein the first circuit board or the second circuit board is a printed circuit board (PCB) comprising a layer of copper foil configured as a shielding layer, the layer of copper foil being grounded.

8. The apparatus of claim 1, further comprising:
an inner shell forming an air duct within the first case.

9. The apparatus of claim 8, wherein the inner shell is mounted on the second circuit board, with a gap formed between a top surface of the inner shell and the top portion of the first case.

10. The apparatus of claim 8, further comprising:
a heat-generating component mounted on the inner shell.

11. The apparatus of claim 8, further comprising:
a third circuit board connected between the first circuit board and the second circuit board along a first sidewall of the first case; and
a fourth circuit board connected between the first circuit board and the second circuit board along a second sidewall of the first case, the third circuit board and the fourth circuit board being opposite to each other.

12. The apparatus of claim 1, further comprising a system shell housing the first case, with at least a portion of an outer surface of the first case being in thermal conductive contact with a portion of an inner surface of the system shell.

13. The apparatus of claim 12, wherein the outer surface of the first case and the portion of the inner surface of the system shell are in a toothed structure.

14. The apparatus of claim 12, further comprising:
a graphene based thermal conductive or thermal interface material (TIM) layer disposed between the outer surface of the first case and the portion of the inner surface of the system shell; or
a thermally conductive reinforcing component disposed between the outer surface of the first case and the portion of the inner surface of the system shell.

15. An apparatus comprising:
a first case comprising a top portion and a bottom portion opposite to each other;
a first printed circuit board (PCB) within the first case, the first PCB having a first surface and a second surface opposite to each other, the first PCB attached to the top portion of the first case via the second surface of the first PCB, and at least one first heat-generating device mounted on the first surface of the first PCB;
a first thermal pad disposed between the first PCB and the top portion of the first case;
a second PCB within the first case, the second PCB having a first surface and a second surface opposite to each other, the second PCB attached to the bottom portion of the first case via the second surface of the second PCB, and at least one second heat-generating device mounted on the first surface of the second PCB;
a third PCB within the first case, the third PCB being connected between the first PCB and the second PCB along a first sidewall of the first case; and
a fourth PCB within the first case, the fourth PCB being connected between the first PCB and the second PCB along a second sidewall of the first case, and the third PCB and the fourth PCB opposite to each other;
a first thermally conductive potting adhesive layer disposed between the first thermal pad and the first PCB.

16. The apparatus of claim 15, further comprising:
a second thermal pad disposed between the second PCB and the bottom portion of the first case;
a third thermal pad disposed between the third PCB and the first sidewall of the first case;
a fourth thermal pad disposed between the fourth PCB and the second sidewall of the first case;
a second thermally conductive potting adhesive layer disposed between the second thermal pad and the second PCB;
a third thermally conductive potting adhesive layer disposed between the third thermal pad and the third PCB; and
a fourth thermally conductive potting adhesive layer disposed between the fourth thermal pad and the fourth PCB.

17. The apparatus of claim 15, further comprising:
a first cable configured to electrically connect the first PCB and the second PCB;
a second cable configured to electrically connect the third PCB and the second PCB; and
a third cable configured to electrically connect the fourth PCB and the second PCB.

18. The apparatus of claim 15, wherein the first PCB, second PCB, third PCB or fourth PCB comprises a layer of copper foil configured as a shielding layer, the layer of copper foil being grounded.

19. The apparatus of claim 15, further comprising:
an inner shell forming an air duct within the first case, the inner shell being surrounded by the first PCB, the second PCB, the third PCB and the fourth PCB.

20. The apparatus of claim 15, further comprising a system shell housing the first case, with an outer surface of the first case being in thermal conductive contact with a portion of an inner surface of the system shell.

* * * * *